(12) United States Patent
Lim et al.

(10) Patent No.: US 12,707,836 B2
(45) Date of Patent: Aug. 11, 2026

(54) DISPLAY DEVICE AND MANUFACTURING METHOD OF THE SAME

(71) Applicant: Samsung Display Co., Ltd., Yongin-Si (KR)

(72) Inventors: Do Gi Lim, Yongin-si (KR); Sung Mo Kang, Yongin-si (KR); Dong Seong Koo, Yongin-si (KR); Su Jung Kim, Yongin-si (KR); Ji Young Bang, Yongin-si (KR); Ji Hea Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 405 days.

(21) Appl. No.: 18/217,314

(22) Filed: Jun. 30, 2023

(65) Prior Publication Data

US 2024/0196674 A1 Jun. 13, 2024

(30) Foreign Application Priority Data

Dec. 13, 2022 (KR) ........................ 10-2022-0173260

(51) Int. Cl.
*H10K 59/131* (2023.01)
*H10K 59/12* (2023.01)
*H10K 71/16* (2023.01)

(52) U.S. Cl.
CPC ....... *H10K 59/131* (2023.02); *H10K 59/1201* (2023.02); *H10K 71/166* (2023.02)

(58) Field of Classification Search
CPC . H10K 59/131; H10K 59/1201; H10K 71/166
See application file for complete search history.

(56) References Cited

U.S. PATENT DOCUMENTS

2007/0181877 A1* 8/2007 Lim ........................ H10D 86/60
257/E27.111
2017/0162606 A1* 6/2017 Yan .................... H10D 30/6734
2017/0336689 A1* 11/2017 Yen ................... G02F 1/136286
2021/0334504 A1* 10/2021 Lu ........................ H10F 39/8053
2022/0130913 A1* 4/2022 Long .................... H10K 59/131
2022/0181354 A1* 6/2022 Lee ....................... H10D 86/423
2022/0199731 A1* 6/2022 Jeong ..................... H10K 59/60
2022/0320220 A1* 10/2022 Wang ................. H10D 30/6723

FOREIGN PATENT DOCUMENTS

KR 10-1110536 B1 2/2012
KR 10-1123329 B1 3/2012
KR 10-1307677 B1 9/2013
KR 10-2018-0018966 A 2/2018
KR 10-2018-0035272 A 4/2018
(Continued)

*Primary Examiner* — Dzung Tran
(74) *Attorney, Agent, or Firm* — Innovation Counsel LLP

(57) ABSTRACT

A display device and a manufacturing method of the same are provided. The display device comprises a substrate, a lower metal layer disposed on the substrate, and a gate metal layer disposed on the lower metal layer, wherein the gate metal layer includes a first portion covering the lower metal layer in a plan view, and a second portion protruding in a first direction from the lower metal layer in a plan view, and the lower metal layer includes a concavo-convex pattern disposed at a portion overlapping the second portion of the gate metal layer.

15 Claims, 18 Drawing Sheets

(56) References Cited

FOREIGN PATENT DOCUMENTS

| | | | |
|---|---|---|---|
| KR | 10-2019-0126777 | A | 11/2019 |
| KR | 10-2020-0128233 | A | 11/2020 |
| KR | 10-2021-0129620 | A | 10/2021 |
| KR | 10-2022-0019735 | A | 2/2022 |
| KR | 10-2022-0037541 | A | 3/2022 |

* cited by examiner

SPXn: SPX1, SPX2, SPX3

FIG. 4

MTL1 : BML, DTL1
MTL2 : ACT2, SE2, DE2
MTL3 : GE2, CPE1
MTL4 : CE1, CE2, CPE1

DISPLAY DEVICE AND MANUFACTURING METHOD OF THE SAME

CROSS-REFERENCE TO RELATED APPLICATION

This application claims priority to Korean Patent Application No. 10-2022-0173260 filed on Dec. 13, 2022, in the Korean Intellectual Property Office, and all the benefits accruing therefrom under 35 U.S.C. 119, the contents of which in its entirety are herein incorporated by reference.

BACKGROUND

1. Technical Field

The present disclosure relates to a display device and a manufacturing method of the same.

2. Description of the Related Art

The importance of a display device is increasing with the development of multimedia. Accordingly, various types of display devices such as an organic light emitting display (OLED) and a liquid crystal display (LCD) are being used.

The display device includes a display panel such as an organic light emitting display panel or a liquid crystal display panel as a device for displaying an image of the display device. An example of the light emitting display panel among the display panels may include a light emitting element such as a light emitting diode (LED), and examples of such a light emitting diode include an organic light emitting diode (OLED) that uses an organic material as a fluorescent material, an inorganic light emitting diode that uses an inorganic material as a fluorescent material, and the like.

SUMMARY

Aspects of the present disclosure provide a display device capable of preventing a metal layer disposed on a lower metal layer from being disconnected.

Aspects of the present disclosure also provide a manufacturing method of a display device capable of preventing a metal layer disposed on a lower metal layer from being disconnected.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a display device comprises a substrate, a lower metal layer disposed on the substrate, and a gate metal layer disposed on the lower metal layer, wherein the gate metal layer includes a first portion covering the lower metal layer in a plan view, and a second portion protruding in a first direction from the lower metal layer in a plan view, and the lower metal layer includes a concavo-convex pattern disposed at a portion overlapping the second portion of the gate metal layer.

In an embodiment, the concavo-convex pattern includes a protruding portion protruding away from the first portion in the first direction, and a recessed portion recessed toward the first portion in the first direction, and an edge of the second portion of the gate metal layer extending in the first direction overlaps the protruding portion.

In an embodiment, the protruding portion includes a first protruding portion and a second protruding portion spaced apart from each other in a second direction intersecting the first direction, and the recessed portion is a portion disposed between the first protruding portion and the second protruding portion.

In an embodiment, the edge includes a first edge and a second edge opposing the first edge, and the first edge overlaps the first protruding portion and the second edge overlaps the second protruding portion.

In an embodiment, at least a portion of the first protruding portion protrudes in the second direction from the first edge and at least a portion of the second protruding portion protrudes in the second direction from the second.

In an embodiment, the recessed portion is completely covered by the second portion of the gate metal layer.

In an embodiment, a width of the protruding portion in the second direction is 2 μm or less.

In an embodiment, a width of the recessed portion in the second direction is 2 μm or less.

In an embodiment, the concavo-convex pattern includes a protruding portion protruding away from the first portion in the first direction, and a recessed portion recessed toward the first portion in the first direction, and an edge of the second portion of the gate metal layer overlaps the recessed portion.

In an embodiment, the recessed portion includes a first recessed portion and a second recessed portion spaced apart from each other in a second direction intersecting the first direction, and the protruding portion is a portion disposed between the first recessed portion and the second recessed portion.

In an embodiment, the first edge overlaps the first recessed portion, and the second edge overlaps the second recessed portion.

In an embodiment, at least a portion of the first recessed portion protrudes in the second direction from the first edge, and at least a portion of the second recessed portion protrudes in the second direction from the second edge.

In an embodiment, the protruding portion is completely covered by the second portion of the gate metal layer.

In an embodiment, a width of the recessed portion in the second direction is 2 μm or less.

In an embodiment, a width of the protruding portion in the second direction is 2 μm or less.

In an embodiment, the display device further comprises a buffer layer disposed between the substrate and the lower metal layer, and a first gate insulating layer disposed between the lower metal layer and the gate metal layer.

In an embodiment, a bottom surface of the concavo-convex pattern is in contact with the buffer layer, a side surface of the concavo-convex pattern is in contact with the first gate insulating layer, and an angle formed by the bottom surface and the side surface of the concavo-convex pattern is 50° or less.

According to an aspect of the present disclosure, a manufacturing method of display device, the manufacturing method comprises forming a material layer for a lower metal layer on a substrate, forming a photoresist layer on the material layer for the lower metal layer, disposing a mask having a light transmitting area and a light blocking area formed therein on the photoresist layer, exposing the photoresist layer using light passing through the light transmitting region of the mask, at least a portion of the light passing through the light transmission area being diffracted to expose a portion of the photoresist layer disposed on a lower side of the light blocking area, forming a photoresist pattern by developing the exposed portion of the photoresist layer, and forming a lower metal layer by etching the material layer for the lower metal layer using the photoresist pattern as an etch mask.

In an embodiment, a light transmitting areas are disposed in the mask, and a separation distance between the light transmitting areas is 2 μm or less.

In an embodiment, the manufacturing method further comprises a buffer layer disposed between the substrate and the lower metal layer, and a first gate insulating layer disposed between the lower metal layer and the gate metal layer, and wherein a bottom surface of the lower metal layer is in contact with the buffer layer, wherein a side surface of the lower metal layer is in contact with the first gate insulating layer, and wherein an angle formed by the bottom surface and the side surface of the lower metal layer is 50° or less.

The display device according to an embodiment may prevent a metal layer disposed on the lower metal layer from being disconnected.

The manufacturing method of a display device according to an embodiment may provide the display device that prevents a metal layer disposed on a lower metal layer from being disconnected.

However, the effects of the embodiments are not restricted to the one set forth herein. The above and other effects of the embodiments will become more apparent to one of daily skill in the art to which the embodiments pertain by referencing the claims.

BRIEF DESCRIPTION OF THE DRAWINGS

The above and other aspects and features of the present disclosure will become more apparent by describing in detail embodiments thereof with reference to the attached drawings, in which:

FIG. 4 is a layout view illustrating a structure of a pixel of the display device according to an embodiment;

DETAILED DESCRIPTION OF THE EMBODIMENTS

The present disclosure will now be described more fully hereinafter with reference to the accompanying drawings, in which preferred embodiments of the inventive concept are shown. This inventive concept may, however, be embodied in different forms and should not be construed as limited to the embodiments set forth herein. Rather, these embodiments are provided so that this disclosure will be thorough and complete, and will filly convey the scope of the inventive concept to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, specific embodiments will be described with reference to the accompanying drawings.

Figure 1:
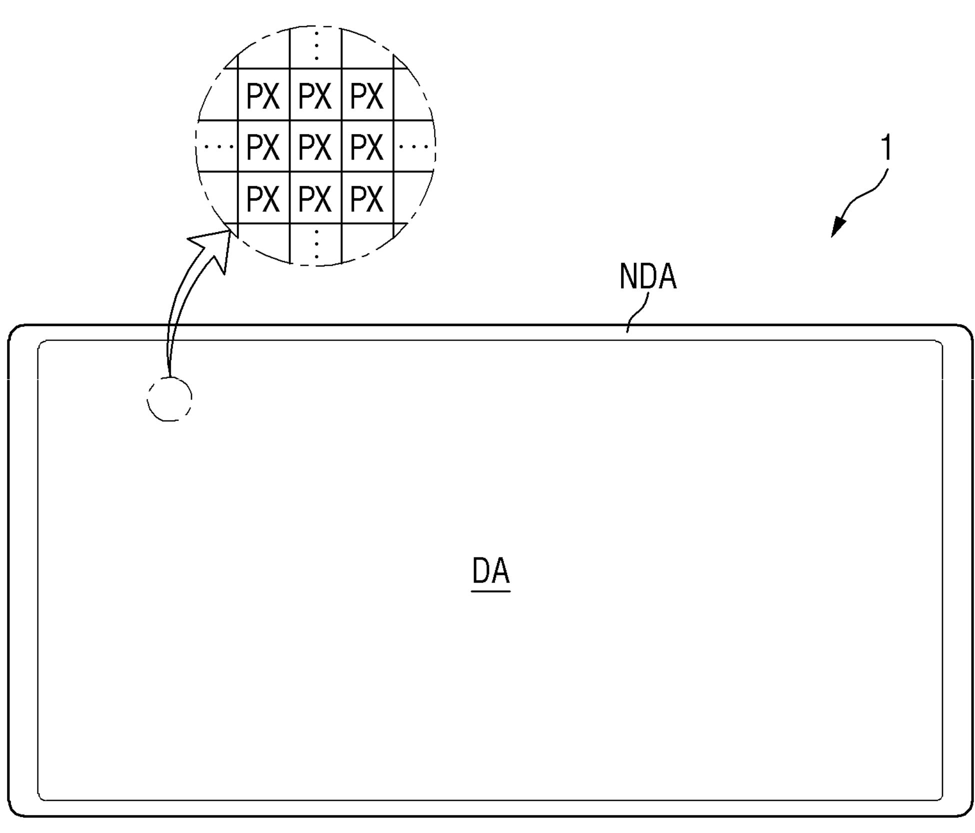
FIG. 1 is a plan view of a display device according to an embodiment.
Figure 1:
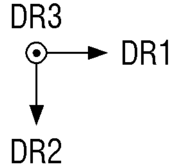

FIG. 1 is a plan view of a display device according to an embodiment.

In FIG. 1, a first direction DR1, a second direction DR2, and a third direction DR3 are defined. The first direction DR1 and the second direction DR2 may be perpendicular to each other, the first direction DR1 and the third direction DR3 may be perpendicular to each other, and the second direction DR2 and the third direction DR3 may be perpendicular to each other. It may be understood that the first direction DR1 means a horizontal direction in the drawings, the second direction DR2 means a vertical direction in the drawings, and the third direction DR3 means upper and lower directions in the drawings, that is, a thickness direction.

In the following specification, unless otherwise specified, the term "direction" may refer to both directions toward both sides extending along the direction. In addition, when both "directions" extending to both sides need to be distinguished from each other, one side will be referred to as "one side in the direction" and the other side will be referred to as "the other side in the direction". In FIG. 1, a direction in which an arrow indicating a direction is directed is referred to as one side, and an opposite direction thereof is referred to as the other side. However, it should be understood that the directions mentioned in the embodiments refer to relative directions, and the embodiments are not limited to the mentioned directions.

For convenience of explanation, in referring to surfaces of the display device 1 or each member constituting the display device 1, one surface facing one side in a direction in which an image is displayed, that is, in the third direction DR3 is referred to as a top surface, and an opposite surface of the one surface is referred to as a bottom surface. However, the present disclosure is not limited thereto, and the one surface and the other surface of the member may be referred to as a front surface and a rear surface, respectively, or may also be referred to as a first surface or a second surface. In addition, in describing a relative position of each member of the display device 1, one side in the third direction DR3 may be referred to as an upper side and the other side in the third direction DR3 may be referred to as a lower side.

Referring to FIG. 1, a display device 1 according to an embodiment displays a moving image or a still image. The display device 1 may refer to any electronic device that provides a display screen. For example, the display device 1 may include televisions, laptop computers, monitors, billboards, Internet of things, mobile phones, smartphones, tablet personal computers (PCs), electronic watches, smartwatches, watch phones, head mounted displays, mobile communication terminals, electronic notebooks, electronic books, portable multimedia players (PMPs), navigation, game consoles, digital cameras, camcorders, and the like that provide the display screen.

The display device 1 includes a display panel for providing a display screen. Examples of the display panel may include an inorganic light emitting diode display panel, an organic light emitting display panel, a quantum dot light emitting display panel, a plasma display panel, and a field emission display panel. Hereinafter, it is illustrated that an inorganic light emitting diode display panel is used as an example of the display panel, but the present disclosure is not limited thereto and may be applied to other display panels as long as the same technical concept is applicable.

A shape of the display device 1 may be variously changed. For example, the display device 1 may have a shape such as a rectangle with a long width, a rectangle with a long length, a square, a quadrangle with rounded corners (vertices), other polygons, or a circle. A shape of a display area DA of the display device 1 may also be similar to an overall shape of the display device 1. In FIG. 1, the display device 1 having a rectangular shape with a long length in the first direction DR1 is illustrated.

The display device 1 may include a display area DA and a non-display area NDA. The display area DA is an area through which an image may be displayed, and the non-display area NDA is an area through which the image is not displayed. The display area DA may also be referred to as an active area, and the non-display area NDA may also be referred to as a non-active area. The display area DA may generally occupy the center of the display device 1.

The display area DA may include a plurality of pixels PX. The plurality of pixels PX may be arranged in a matrix configuration. A shape of each pixel PX may be a rectangular shape or a square shape in a plan view, but is not limited thereto, and may also be a rhombic shape of which each side is inclined with respect to one direction. Each pixel PX may be arranged in a stripe type or an island type. In addition, each of the pixels PX may include one or more light emitting elements that emit light of a specific wavelength band to display a specific color.

The non-display area NDA may be disposed around the display area DA. The non-display area NDA may entirely or partially surround the display area DA. The display area DA may have a rectangular shape, and the non-display area NDA may be disposed to be adjacent to four sides of the display area DA. The non-display area NDA may constitute a bezel of the display device 1. In each of the non-display areas NDA, lines, a power supply unit, or circuit driving units included in the display device 1 may be disposed, or external devices may be mounted.

Figure 2:
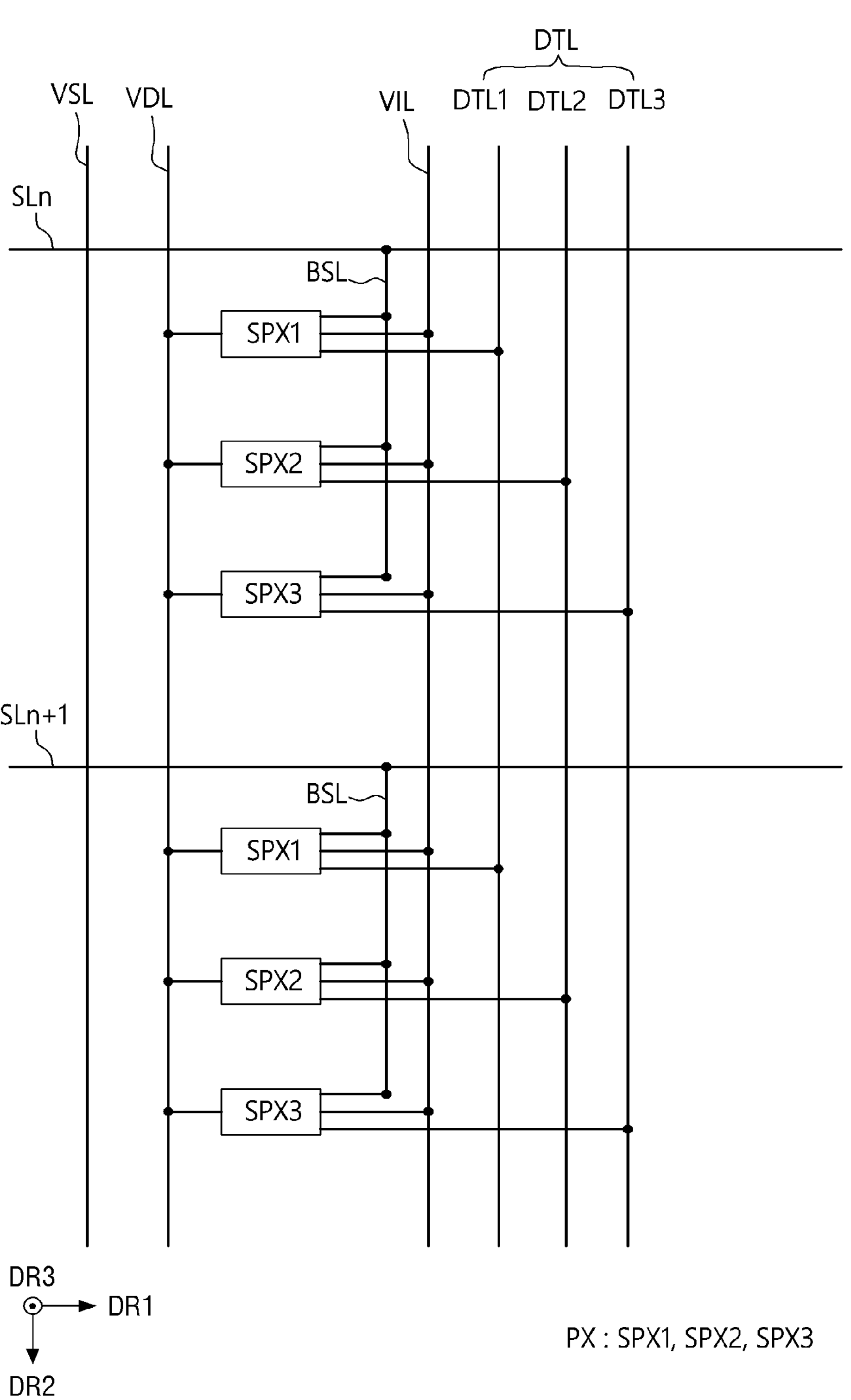
FIG. 2 is a layout view illustrating an arrangement of a plurality of lines disposed in a display area of the display device according to an embodiment.

FIG. 2 is a layout view illustrating an arrangement of a plurality of lines disposed in a display area of the display device according to an embodiment.

Referring to FIG. 2, a display area DA may include a pixel PX, a scan line SL, a data line DTL, an initialization voltage line VIL, a first voltage line VDL, and a second voltage line VSL. Pixels PX may be formed in each pixel area intersected by the data lines DTL and the scan lines SL.

The pixel PX may include a first sub-pixel SPX1, a second sub-pixel SPX2, and a third sub-pixel SPX3. Each of the first sub-pixel SPX1, the second sub-pixel SPX2, and the third sub-pixel SPX3 may be defined as a minimum unit area that emits light.

Each of the first sub-pixel SPX1, the second sub-pixel SPX2, and the third sub-pixel SPX3 may emit light having different wavelengths. In some embodiments, the first sub-pixel SPX1 may emit, for example, red light as light of a first color, the second sub-pixel SPX2 may emit, for example, green light as light of a second color, and the third sub-pixel SPX3 may emit, for example, blue light as light of a third color.

A pixel circuit of the first sub-pixel SPX1, a pixel circuit of the third sub-pixel SPX3, and a pixel circuit of the second sub-pixel SPX2 may be sequentially arranged in one side of the second direction DR2, but are not limited thereto.

Each of the first sub-pixel SPX1, the second sub-pixel SPX2, and the third sub-pixel SPX3 may be connected to one scan line SL and one data line DTL.

Meanwhile, in the present specification, the term 'connection' may mean that any one member is connected to another member through mutual physical contact, as well as that any one member is connected to another member through the other member. In addition, it may be understood that any one portion and another portion as one integrated member are interconnected due to the integrated member. Furthermore, the connection between any one member and another member may be interpreted as the meaning including an electrical connection through the other member in addition to a connection through direct contact therebetween.

The scan lines SL may be connected to a driving unit (not illustrated) and extend in the first direction DR1, and may be spaced apart from each other in the second direction DR2. For example, an n-th scan line SLn (where n is a natural number) and an n+1-th scan line SLn+1 may be disposed adjacent to each other in the second direction DR2 and spaced apart from each other in the second direction DR2.

An auxiliary scan line BSL may extend from the scan line SL in the second direction DR2 to supply a scan signal to each of the first sub-pixel SPX1, the second sub-pixel SPX2, and the third sub-pixel SPX3.

The data lines DTL may extend in the second direction DR2 and may be spaced apart from each other in the first direction DR1. The data lines DTL may include a first data line DTL1, a second data line DTL2, and a third data line DTL3. Each of the first data line DTL1, the second data line DTL2, and the third data line DTL3 may supply a data voltage to each of the first sub-pixel SPX1, the second sub-pixel SPX2, and the third sub-pixel SPX3.

The initialization voltage line VIL may extend in the second direction DR2. The initialization voltage line VIL may supply an initialization voltage received from the driving unit (not illustrated) to each of the first sub-pixel SPX1, the second sub-pixel SPX2, and the third sub-pixel SPX3.

The first voltage line VDL may extend in the second direction DR2. The first voltage line VDL may supply a driving voltage or a high potential voltage received from the power supply unit (not illustrated) to each of the first sub-pixel SPX1, the second sub-pixel SPX2, and the third sub-pixel SPX3.

The second voltage line VSL may extend in the second direction DR2. The second voltage line VSL may supply a low potential voltage received from the power supply unit (not illustrated) to each of the first sub-pixel SPX1, the second sub-pixel SPX2, and the third sub-pixel SPX3.

Meanwhile, the connection relationship between the pixel PX, the scan line SL, the data line DTL, the initialization voltage line VIL, the first voltage line VDL, and the second voltage line VSL is not limited to the description described above, but may be designed and changed according to the number and arrangement of the pixels PX.

Hereinafter, a circuit structure of a sub-pixel SPXn (n=1, 2, and 3) of the display device 1 according to an embodiment will be described.

Figure 3:
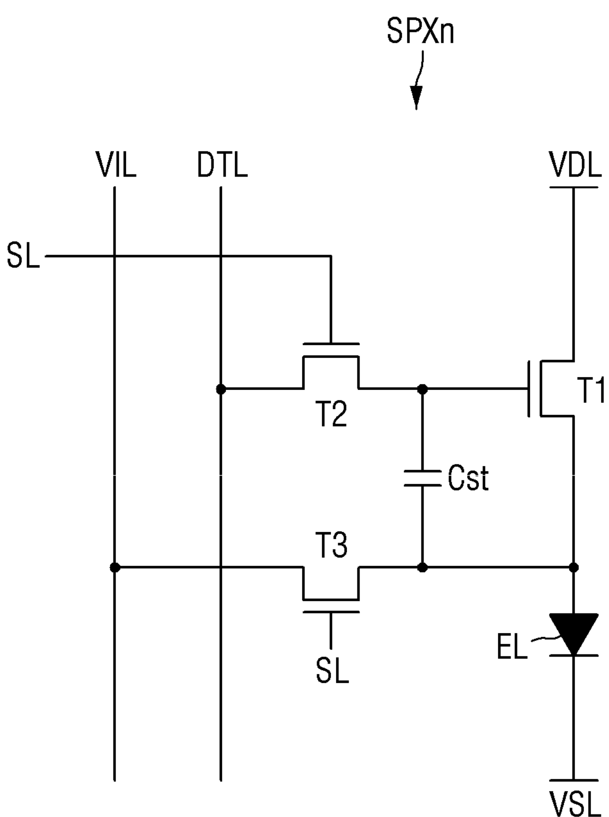
FIG. 3 is an equivalent circuit diagram of a sub-pixel of the display device according to an embodiment.

FIG. 3 is an equivalent circuit diagram of a sub-pixel of the display device according to an embodiment.

Referring to FIG. 3, each sub-pixel SPXn of the display device 1 according to an embodiment includes three transistors T1, T2, and T3 and one storage capacitor Cst, in addition to a light emitting diode EL.

The light emitting diode EL emits light according to a current supplied through a first thin film transistor T1. The light emitting diode EL includes a first electrode, a second electrode, and at least one light emitting element disposed between the first electrode and the second electrode. The light emitting element may emit light in a specific wavelength band by electrical signals transferred from the first electrode and the second electrode.

One end of the light emitting element EL may be connected to a source electrode of the first thin film transistor T1, and the other end of the light emitting element EL may be connected to the second voltage line VSL to which a low potential voltage (hereinafter, referred to as a second power voltage) lower than a high potential voltage (hereinafter, referred to as a first power voltage) of the first voltage line VDL is supplied.

Although it is illustrated in the following specification that the light emitting diode EL is an organic light emitting diode (OLED), the type of light emitting diode EL is not limited thereto as long as the technical idea of the present disclosure may be applied.

The first thin film transistor T1 adjusts a current flowing from the first voltage line VDL to which the first power voltage is supplied to the light emitting diode EL according to a voltage difference between a gate electrode and the source electrode thereof. As an example, the first thin film transistor T1 may be a driving transistor for driving the light emitting diode EL. The gate electrode of the first thin film transistor T1 may be connected to a source electrode of a second thin film transistor T2, the source electrode of the first thin film transistor T1 may be connected to the first electrode of the light emitting diode EL, and a drain electrode of the first thin film transistor T1 may be connected to the first voltage line VDL to which the first power voltage is applied.

The second thin film transistor T2 is turned on by a scan signal of the gate line SL to connect the data line DTL to the gate electrode of the first thin film transistor T1. A gate electrode of the second thin film transistor T2 may be connected to the scan line SL, the source electrode of the second thin film transistor T2 may be connected to the gate electrode of the first thin film transistor T1, and a drain electrode of the second thin film transistor T2 may be connected to the data line DTL.

A third thin film transistor T3 is turned on by a scan signal of the scan line SL to connect the initialization voltage line VIL to one end (an anode) of the light emitting diode EL. A gate electrode of the third thin film transistor T3 is connected to the scan line SL, a drain electrode of the third thin film transistor T3 may be connected to the initialization voltage line VIL, and a source electrode of the third thin film transistor T3 may be connected to the one end of the light emitting diode EL or the source electrode of the first thin film transistor T1.

In an embodiment, the source electrode and the drain electrode of each of the thin film transistors T1, T2, and T3 are not limited to those described above, and vice versa. Each of the thin film transistors T1, T2, and T3 may be formed as a thin film transistor. It is mainly described in FIG. 3 that each of the thin film transistors T1, T2, and T3 is formed as an N-type metal oxide semiconductor field effect transistor (MOSFET), but the present disclosure is not limited thereto. That is, each of the thin film transistors T1, T2, and T3 may be formed as a P-type MOSFET, or some of the thin film transistors T1, T2, and T3 may be formed as an N-type MOSFET and others of the thin film transistors T1, T2, and T3 may be formed as a P-type MOSFET.

The storage capacitor Cst is formed between the gate electrode and the source electrode of the first thin film transistor T1. The storage capacitor Cst stores a voltage difference between a gate voltage and a source voltage of the first thin film transistor T1.

In the embodiment of FIG. 3, the gate electrode of the second thin film transistor T2 may be connected to a scan line SL, and the gate electrode of the third thin film transistor T3 may be connected to the same scan line SL. In other words, the second thin film transistor T2 and the third thin film transistor T3 may be turned on by a scan signal applied from the same scan line SL. However, the present disclosure is not limited thereto, and the second thin film transistor T2 and the third thin film transistor T3 may be connected to different scan lines and turned on by scan signals applied from the different scan lines.

Hereinafter, a structure of the pixel PX of the display device 1 according to an embodiment will be described.

Figure 4:
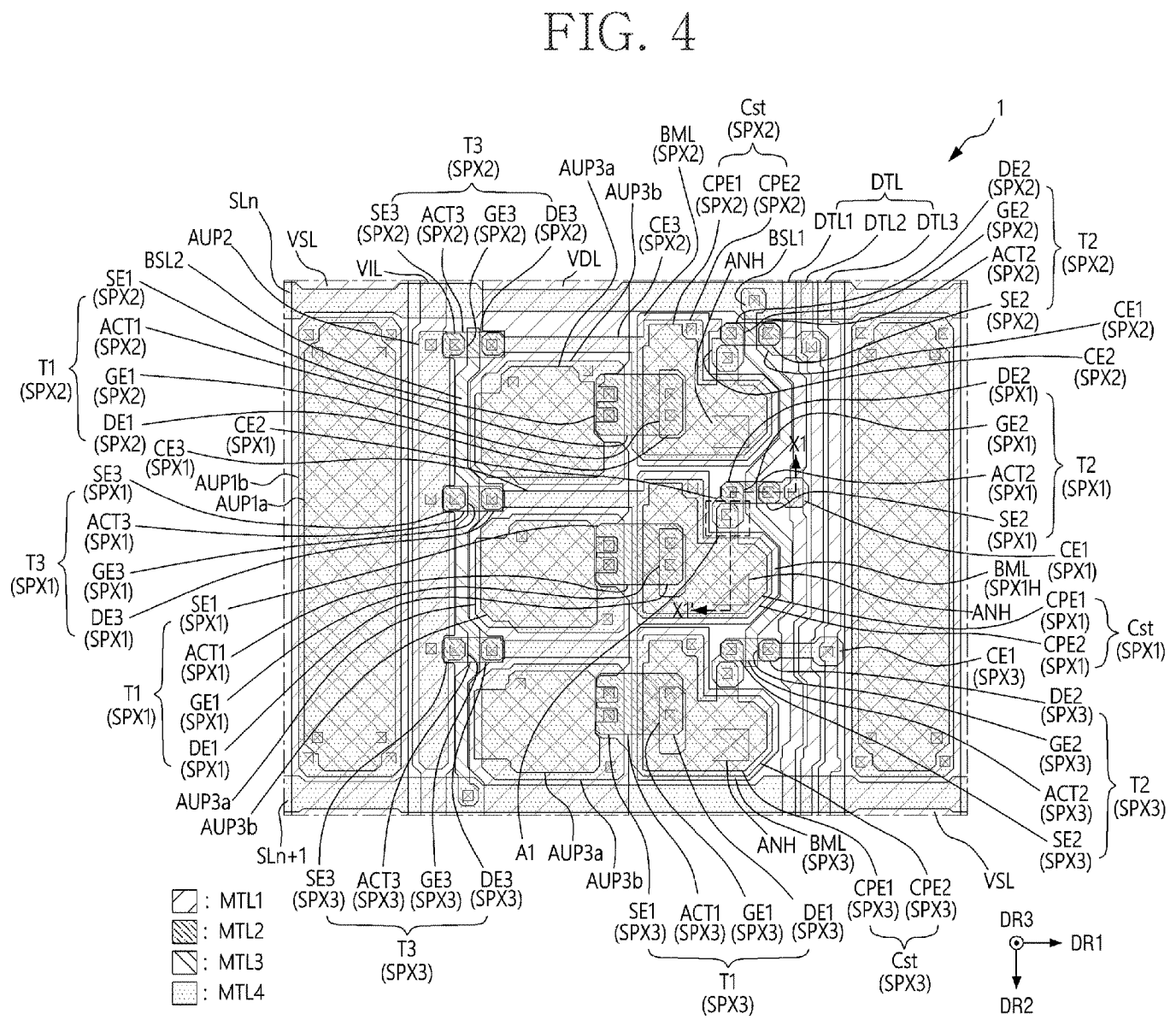
Figure 5:
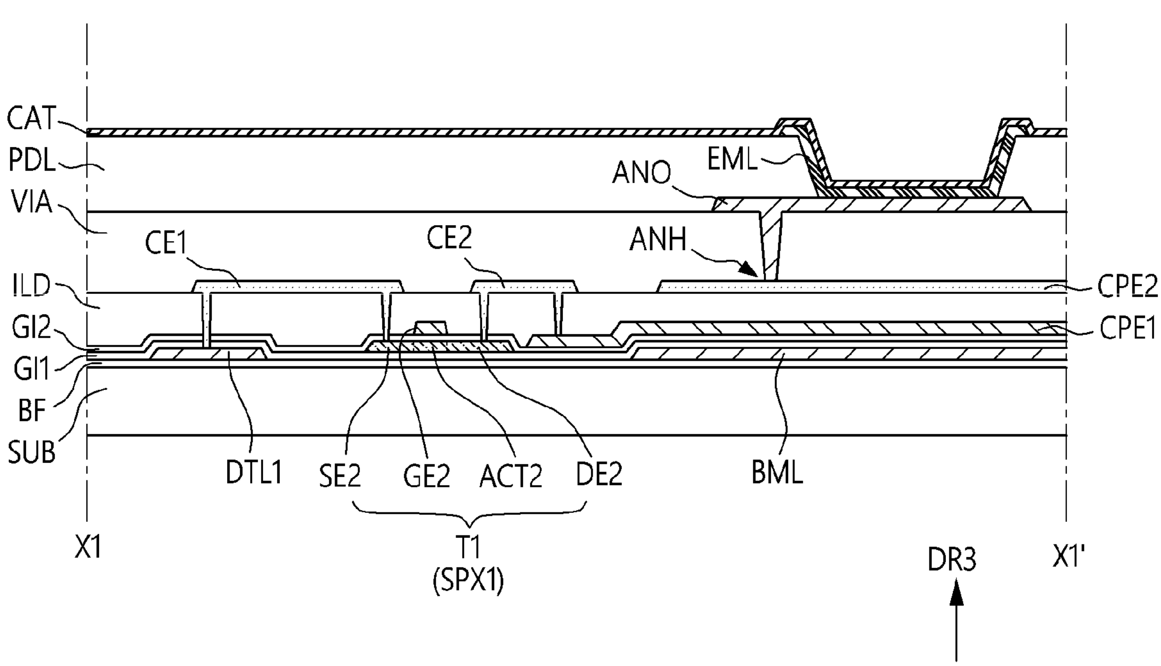
FIG. 5 is a cross-sectional view schematically illustrating a cross section taken along line X1-X1' of FIG. 4.

FIG. 4 is a layout view illustrating a structure of a pixel of the display device according to an embodiment. FIG. 5 is a cross-sectional view schematically illustrating a cross section taken along line X1-X1' of FIG. 4. FIG. 5 illustrates an example of a stacked structure of the first sub-pixel SPX1.

Referring to FIGS. 4 and 5, the display device 1 according to an embodiment may include a first conductive layer MTL1, a second conductive layer MTL2, a third conductive layer MTL3, and a fourth conductive layer MTL4 sequentially stacked in the third direction DR3.

An insulating layer may be disposed between the first conductive layer MTL1, the second conductive layer MTL2, the third conductive layer MTL3, and the fourth conductive layer MTL4. For example, the display device 1 according to an embodiment may have a structure in which a substrate SUB, a buffer layer BF, a first conductive layer MTL1, a first gate insulating layer GI1, a second conductive layer MTL2, a second gate insulating layer GI2, a third conductive layer MTL3, an interlayer insulating layer ILD, a fourth conductive layer MTL4, a via insulating layer VIA, an anode electrode ANO, a pixel defining film PDL, an emitting material layer EML, and a cathode electrode CAT are sequentially stacked on one side of the substrate SUB in the third direction DR3. The plurality of conductive layers and the plurality of insulating layers described above may constitute a thin film transistor of the display device 1.

The substrate SUB may be made of an insulating material such as glass, quartz, or a polymer resin. In addition, the substrate SUB may be a rigid substrate, but may also be a flexible substrate that may be bent, folded, or rolled.

The buffer layer BF may be disposed on the substrate SUB. The buffer layer BF may serve to protect the transistors of the pixel PX from moisture permeating through the substrate SUB which is vulnerable to moisture permeation.

The first conductive layer MTL1 may be disposed on the buffer layer BF. The first conductive layer MTL1 may include a first voltage line VDL, a second voltage line VSL, an initialization voltage line VIL, a data line DTL, and a lower metal layer BML disposed in each sub-pixel SPXn.

Each of the first voltage line VDL, the second voltage line VSL, the initialization voltage line VIL, and the data line DTL may have a shape substantially extending in the second direction DR2.

The first voltage line VDL, the second voltage line VSL, the initialization voltage line VIL, and the data line DTL may be spaced apart from each other in the first direction DR1. For example, the lower metal layer BML and the data line DTL of each sub-pixel SPXn may be disposed on one side of the first voltage line VDL in the first direction DR1, and the second voltage line VSL and the initialization voltage line VIL may be disposed on the other side of the first voltage line VDL in the first direction DR1.

The data lines DTL may include the first data line DTL1, the second data line DTL2, and the third data line DTL3 as described above. The second data line DTL2 may be disposed between the first data line DTL1 and the third data line DTL3.

In some embodiments, the initialization voltage line VIL may be disposed between the first voltage line VDL and the second voltage line VSL, and the lower metal layer BML of each sub-pixel SPXn may be disposed between the first voltage line VDL and the data line DTL, but the present disclosure is not limited thereto.

The lower metal layer BML is disposed in each sub-pixel SPXn to overlap a first semiconductor layer ACT1 of the first thin film transistor T1 of each sub-pixel SPXn. The lower metal layer BML may perform a function of preventing light from being incident on the first semiconductor layer ACT1 of the first thin film transistor T1 of each sub-pixel SPXn or stabilizing electrical characteristics of the first thin film transistor T1 by being electrically connected to the first semiconductor layer ACT1.

The first conductive layer MTL1 may include one or more metals selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu), but is not limited thereto.

The first gate insulating layer GI1 is disposed on the first conductive layer MTL1. The first gate insulating layer GI1 may serve as a gate insulating film of each of the transistors. It is illustrated in the drawing that the first gate insulating layer GI1 is entirely disposed on the buffer layer BF and the first conductive layer MTL1.

A semiconductor layer is disposed on the first gate insulating layer GI1. The semiconductor layer may include an active layer ACT which constitutes a channel region and the second conductive layer MTL2 which constitutes a source electrode SE and a drain electrode DE of each thin film transistor of the sub-pixel SPXn.

For example, the second conductive layer MTL2 may include a first source electrode SE1 and a first drain electrode DE1 of the first thin film transistor T1, a second source electrode SE2 and a second drain electrode DE1 of the second thin film transistor T2, and a third source electrode SE3 and a third drain electrode DE3 of the third thin film transistor T3 disposed in each sub-pixel SPXn. The semiconductor layer of each of the thin film transistors of the sub-pixel SPXn may be disposed to partially overlap gate electrodes described later.

The semiconductor layer may include polycrystalline silicon, single crystal silicon, an oxide semiconductor, or the like. In another embodiment, the semiconductor layer may also include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

The second gate insulating layer GI2 is disposed on the semiconductor layer. The second gate insulating layer GI2 may serve as a gate insulating film of each of the transistors. It is illustrated in the drawing that the second gate insulating layer GI2 is entirely disposed on the first gate insulating layer GI1 and the semiconductor layer, but the present disclosure is not limited thereto. For example, the second gate insulating layer GI2 may be patterned together with the gate electrode disposed thereon and may be partially disposed between the semiconductor layer and the third conductive layer MTL3.

The third conductive layer MTL3 is disposed on the second gate insulating layer GI2. The third conductive layer MTL3 may include a first auxiliary scan line BSL1, a second auxiliary scan line BSL2, a first lower line electrode AUP1*a*, a third lower line electrode AUP3*a*, and a first capacitor electrode CPE1 of each of the sub-pixels SPXn.

The first auxiliary scan line BSL1 may be electrically connected to an n-th scan line SLn of the fourth conductive layer MTL4 disposed thereon through a contact hole to apply the scan signal to the second thin film transistor T2 of the sub-pixel SPXn. For example, the first auxiliary scan line BSL1 may have a shape generally extending in the second direction DR2, and may intersect and overlap the second semiconductor layer ACT2 of each of the first sub-pixel SPX1, the second sub-pixel SPX2, and the third sub-pixel SPX3.

A portion of the first auxiliary scan line BSL1 intersecting and overlapping the second semiconductor layer ACT2 of each of the first sub-pixel SPX1, the second sub-pixel SPX2, and the third sub-pixel SPX3 may be a second gate electrode GE2 of the second thin film transistor T2 disposed in each sub-pixel SPXn.

Accordingly, a portion where the second semiconductor layer ACT2 of each of the first sub-pixel SPX1, the second sub-pixel SPX2, and the third sub-pixel SPX3 and the second gate electrode GE2 of the first auxiliary scan line BSL1 overlap in the third direction DR3 may be a second channel region, a portion of the second semiconductor layer ACT2 disposed in each sub-pixel SPXn disposed on one side of the second channel region in the first direction DR1 may be a second source electrode SE2 of the second thin film transistor T2 disposed in each sub-pixel SPXn, and a portion of the second semiconductor layer ACT2 disposed in each sub-pixel SPXn disposed on the other side of the second channel region in the first direction DR1 may be a second drain electrode DE2 of the second thin film transistor T2 disposed in each sub-pixel SPXn.

The second source electrode SE2 disposed in each sub-pixel SPXn may be electrically connected to a first connection electrode CE1 of the fourth conductive layer MTL4 disposed thereon through a contact hole, and the first connection electrode CE1 may be electrically connected to the data line DTL through the contact hole. For example, the second source electrode SE2 of the first sub-pixel SPX1 may be connected to the first data line DTL1 through the first connection electrode CE1 disposed thereon, the second source electrode SE2 of the second sub-pixel SPX2 may be connected to the second data line DTL2 through the first connection electrode CE1 disposed thereon, and the second source electrode SE2 of the third sub-pixel SPX3 may be connected to the third data line DTL3 through the first connection electrode CE1 disposed thereon.

The second drain electrode DE2 disposed in each sub-pixel SPXn may be electrically connected to a second connection electrode CE2 of the fourth conductive layer MTL4 disposed thereon through a contact hole, and the second connection electrode CE2 may be electrically connected to a first capacitor electrode CPE1 described later through the contact hole. For example, the second drain electrode DE2 of the first sub-pixel SPX1 may be connected to the first capacitor electrode CPE1 of the first sub-pixel SPX1 through the second connection electrode CE2 disposed thereon, the second drain electrode DE2 of the second sub-pixel SPX2 may be connected to the first capacitor electrode CPE1 of the second sub-pixel SPX2 through the second connection electrode CE2 disposed thereon, and the second drain electrode DE2 of the third sub-pixel SPX3 may be connected to the first capacitor electrode CPE1 of the third sub-pixel SPX3 through the second connection electrode CE2 disposed thereon.

The second auxiliary scan line BSL2 may be electrically connected to an n+1-th scan line SLn+1 of the fourth conductive layer MTL4 disposed thereon through a contact hole to apply the scan signal to the third thin film transistor T3 of the sub-pixel SPXn. For example, the second auxiliary scan line BSL2 may have a shape generally extending in the second direction DR2, and may intersect and overlap the third semiconductor layer ACT3 of each of the first sub-pixel SPX1, the second sub-pixel SPX2, and the third sub-pixel SPX3.

A portion of the second auxiliary scan line BSL2 intersecting and overlapping the third semiconductor layer ACT3 of each of the first sub-pixel SPX1, the second sub-pixel SPX2, and the third sub-pixel SPX3 may be a third gate electrode GE3 of the third thin film transistor T3 disposed in each sub-pixel SPXn.

Accordingly, a portion where the third semiconductor layer ACT3 of each of the first sub-pixel SPX1, the second sub-pixel SPX2, and the third sub-pixel SPX3 and the third gate electrode GE3 of the second auxiliary scan line BSL2 overlap in the third direction DR3 may be a third channel region, a portion of the third semiconductor layer ACT3 disposed in each sub-pixel SPXn disposed on one side of the third channel region in the first direction DR1 may be a third source electrode SE3 of the third thin film transistor T3 disposed in each sub-pixel SPXn, and a portion of the third semiconductor layer ACT3 disposed in each sub-pixel SPXn disposed on the other side of the third channel region in the first direction DR1 may be a third drain electrode DE3 of the third thin film transistor T3 disposed in each sub-pixel SPXn.

The third source electrode SE3 disposed in each sub-pixel SPXn may be electrically connected to a second line electrode AUP2 of the fourth conductive layer MTL4 disposed thereon through a contact hole, and the second line electrode AUP2 may be electrically connected to the initialization voltage line VIL through the contact hole. For example, the third source electrode SE3 of the first sub-pixel SPX1, the third source electrode SE3 of the second sub-pixel SPX2, and the third source electrode SE3 of the third sub-pixel SPX3 may be connected to the initialization voltage line VIL through the second line electrode AUP2 disposed thereon.

The third drain electrode DE3 disposed in each sub-pixel SPXn may be electrically connected to a third connection electrode CE3 of the fourth conductive layer MTL4 disposed thereon through a contact hole, and the third connection electrode CE3 may be electrically connected to a first drain electrode DE1 described later through the contact hole. For example, the third connection electrode CE3 of the fourth conductive layer MTL4 may be formed integrally with a second capacitor electrode CPE2, and the second capacitor electrode CPE2 may be electrically connected to the first drain electrode DE1 of the first thin film transistor T1.

For example, the third drain electrode DE3 of the first sub-pixel SPX1 may be connected to the first drain electrode DE1 of the first sub-pixel SPX1 through the third connection electrode CE3 disposed thereon, the third drain electrode DE3 of the second sub-pixel SPX2 may be connected to the first drain electrode DE1 of the second sub-pixel SPX2 through the third connection electrode CE3 disposed thereon, and the third drain electrode DE3 of the third sub-pixel SPX3 may be connected to the first drain electrode DE1 of the third sub-pixel SPX3 through the third connection electrode CE3 disposed thereon.

The first lower line electrode AUP1*a* may be disposed on the second voltage line VSL. The first lower line electrode AUP1*a* may have a shape generally extending in the second direction DR2. The first lower line electrode AUP1*a* may be electrically connected to the second voltage line VSL through a contact hole, and may serve to reduce a line voltage acting on the second voltage line VSL.

The third lower line electrode AUP3*a* may be disposed on the first voltage line VDL. In some embodiments, the third lower line electrodes AUP3*a* may be disposed to be spaced apart from each other for each sub-pixel SPXn, but are not limited thereto. For example, the third lower line electrodes AUP3*a* disposed in each sub-pixel SPXn may be integrally formed to have a shape generally extending in the second direction DR2. The third lower line electrode AUP3*a* may be electrically connected to the first voltage line VDL through a contact hole, and may serve to reduce a line voltage acting on the first voltage line VDL.

The first capacitor electrode CPE1 of each of the sub-pixels SPXn may be one electrode of the storage capacitor Cst described above with reference to FIG. 3.

A hole corresponding to a portion of the first semiconductor layer ACT1 on one side of the first direction DR1 may be formed in the first capacitor electrode CPE1 of each of the sub-pixels SPXn. Accordingly, a portion positioned on the other side of the hole in the first direction DR1 may have a shape crossing the first semiconductor layer ACT1 of each sub-pixel SPXn in a plan view, and a portion of the first capacitor electrode CPE1 crossing the first semiconductor layer ACT1 in a plan view may be the first gate electrode GE1 of the first thin film transistor T1. For example, a portion of the first capacitor electrode CPE1 of the first sub-pixel SPX1 crossing the first semiconductor layer ACT1 of the first sub-pixel SPX1 in a plan view may be the first gate electrode GE1 of the first thin film transistor T1 of the first sub-pixel SPX1, a portion of the first capacitor electrode CPE1 of the second sub-pixel SPX2 crossing the first semiconductor layer ACT1 of the second sub-pixel SPX2 in a plan view may be the first gate electrode GE1 of the first thin film transistor T1 of the second sub-pixel SPX2, and a portion of the first capacitor electrode CPE1 of the third sub-pixel SPX3 crossing the first semiconductor layer ACT1 of the third sub-pixel SPX3 in a plan view may be the first gate electrode GE1 of the first thin film transistor T1 of the third sub-pixel SPX3.

In this case, a portion where the first semiconductor layer ACT1 and the first capacitor electrode CPE1 of each of the first sub-pixel SPX1, the second sub-pixel SPX2, and the third sub-pixel SPX3 overlap in a plan view may be a first channel region, a portion of the first semiconductor layer ACT1 disposed in each sub-pixel SPXn disposed on one side of the first channel region in the first direction DR1 may be a first source electrode SE1 of the first thin film transistor T1 disposed in each sub-pixel SPXn, and a portion of the first semiconductor layer ACT1 disposed in each sub-pixel SPXn disposed on the other side of the first channel region in the first direction DR1 may be a first drain electrode DE1 of the first thin film transistor T1 disposed in each sub-pixel SPXn.

The first source electrode SE1 disposed in each sub-pixel SPXn may be electrically connected to the first voltage line VDL disposed on a lower side thereof through a contact hole. For example, the first source electrode SE1 of the first sub-pixel SPX1 may be electrically connected to the first voltage line VDL disposed on a lower side thereof through the contact hole, the first source electrode SE1 of the second sub-pixel SPX2 may be electrically connected to the first voltage line VDL disposed on a lower side thereof through the contact hole, and the first source electrode SE1 of the third sub-pixel SPX3 may be electrically connected to the first voltage line VDL disposed on a lower side thereof through the contact hole.

The first drain electrode DE1 disposed in each sub-pixel SPXn may be electrically connected to the second capacitor electrode CPE2 of the fourth conductive layer MTL4 disposed thereon through a contact hole, a portion of the second capacitor electrode CPE2 may protrude in the first direction DR1 to form a third connection electrode CE3, and the third connection electrode CE3 may be electrically connected to the second drain electrode DE2 disposed on a lower side thereof through a contact hole. For example, the first drain electrode DE1 of the first sub-pixel SPX1 may be electrically connected to the second capacitor electrode CPE2 disposed thereon, the first drain electrode DE1 of the second sub-pixel SPX2 may be electrically connected to the second capacitor electrode CPE2 disposed thereon, and the first drain electrode DE1 of the third sub-pixel SPX3 may be electrically connected to the second capacitor electrode CPE2 disposed thereon.

The third conductive layer MTL3 may include one or more metals selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu), but is not limited thereto.

The interlayer insulating layer ILD is disposed on the third conductive layer MTL3. The interlayer insulating layer ILD may perform a function of an insulating film between the third conductive layer MTL3 and other layers disposed thereon, and may protect the third conductive layer MTL3.

The fourth conductive layer MTL4 is disposed on the interlayer insulating layer ILD. The fourth conductive layer MTL4 may include a scan line SL, a first upper line electrode AUP1*b*, a second upper line electrode AUP2, a third upper line electrode AUP3*b*, and a first connection electrode CE1, a second connection electrode CE2, a third connection electrode CE3, and a second capacitor electrode CPE2 disposed in each sub-pixel SPXn.

The scan line SL may generally extend in the first direction DR1. An n-th scan line SLn and an n+1-th scan line SLn+1 may be spaced apart from each other in the second direction DR2. The n-th scan line SLn may be electrically connected to the first auxiliary scan line BSL1, and the n+1-th scan line SLn+1 may be electrically connected to the second auxiliary scan line BSL2.

The first upper line electrode AUP1*b* may be disposed on the second voltage line VSL and the first lower line electrode AUP1*a*. The first upper line electrode AUP1*b* may generally extend in the second direction DR2. The first upper line electrode AUP1*b* may be electrically connected to the second voltage line VSL through a contact hole, and may serve to reduce a line voltage acting on the second voltage line VSL.

The second upper line electrode AUP2 may be disposed on the initialization voltage line VIL. The second upper line electrode AUP2 may generally extend in the second direction DR2. The second upper line electrode AUP2 may be electrically connected to the initialization voltage line VIL through a contact hole, and may serve to reduce a line voltage acting on the initialization voltage line VIL.

The third upper line electrode AUP3*b* may be disposed on the first voltage line VDL and the third lower line electrode AUP3*a*. The third upper line electrode AUP3*b* may be disposed in each pixel SPXn. The third upper line electrodes AUP3*b* disposed in each sub-pixel SPXn may be spaced apart from each other in the second direction DR2 with the third connection electrode CE3 interposed therebetween.

The first connection electrode CE1 disposed in each sub-pixel SPXn may connect the first source electrode SE1 of each sub-pixel SPXn and the data line DTL. For example, the first connection electrode CE1 of the first sub-pixel SPX1 may connect the first source electrode SE1 of the first sub-pixel SPX1 and the first data line DTL1, the first connection electrode CE1 of the second sub-pixel SPX2 may connect the first source electrode SE1 of the second sub-pixel SPX2 and the second data line DTL2, and the first connection electrode CE1 of the third sub-pixel SPX3 may connect the first source electrode SE1 of the third sub-pixel SPX3 and the third data line DTL3.

The second connection electrode CE2 disposed in each sub-pixel SPXn may connect the first drain electrode DE1 of each sub-pixel SPXn and a protruding portion of the first capacitor electrode CPE1. For example, the second connection electrode CE2 of the first sub-pixel SPX1 may connect the first drain electrode DE1 of the first sub-pixel SPX1 and the protruding portion of the first capacitor electrode CPE1, the second connection electrode CE2 of the second sub-pixel SPX2 may connect the first drain electrode DE1 of the second sub-pixel SPX2 and the protruding portion of the first capacitor electrode CPE1, and the second connection electrode CE2 of the third sub-pixel SPX3 may connect the first drain electrode DE1 of the third sub-pixel SPX3 and the protruding portions of the first capacitor electrode CPE1.

The protruding portion of the first capacitor electrode CPE1 may protrude in the second direction DR2 from the lower metal layer BML disposed on a lower side thereof in a plan view. When a taper angle formed by the lower metal layer BML is large, the protruding portion of the first capacitor electrode CPE1 may be disconnected. Accordingly, it is possible to prevent the protruding portion of the first capacitor electrode CPE1 from being disconnected by lowering the taper angle formed by the lower metal layer BML.

The second capacitor electrode CPE2 disposed in each sub-pixel SPXn may be disposed on the first capacitor electrode CPE1 to overlap the first capacitor electrode CPE1 disposed in each sub-pixel SPXn to form a storage capacitor Cst. For example, the second capacitor electrode CPE2 of the first sub-pixel SPX1 may form the storage capacitor Cst of the first sub-pixel SPX1 together with the first capacitor electrode CPE1 disposed on a lower side thereof, the second capacitor electrode CPE2 of the second sub-pixel SPX2 may form the storage capacitor Cst of the second sub-pixel SPX2 together with the first capacitor electrode CPE1 disposed on a lower side thereof, and the second capacitor electrode CPE2 of the third sub-pixel SPX3 may form the storage capacitor Cst of the third sub-pixel SPX3 together with the first capacitor electrode CPE1 disposed on a lower side thereof.

The third connection electrode CE3 disposed in each sub-pixel SPXn may be a portion protruding from the second capacitor electrode CPE2 disposed in each sub-pixel SPXn in the first direction DR1. The third connection electrode CE3 disposed in each sub-pixel SPXn may be electrically connected to the third drain electrode DE3 disposed in each sub-pixel SPXn. For example, the third connection electrode CE3 disposed in the first sub-pixel SPX1 may be connected to the third drain electrode DE3 of the first sub-pixel SPX1, the third connection electrode CE3 disposed in the second sub-pixel SPX2 may be connected to the third drain electrode DE3 of the second sub-pixel SPX2, and the third connection electrode CE3 disposed in the third sub-pixel SPX3 may be connected to the third drain electrode DE3 of the third sub-pixel SPX3.

The fourth conductive layer MTL4 may include one or more metals selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu), but is not limited thereto.

The via insulating layer VIA may be disposed on the fourth conductive layer MTL4. The via insulation layer VIA may serve to planarize a step formed by conductive layers disposed on a lower side thereof.

An anode contact hole ANH formed through the via insulation layer VIA and electrically connecting the second capacitor electrode CPE2 and the anode electrode ANO of each sub-pixel SPXn may be formed in the via insulating layer VIA. In some embodiments, the via insulation layer VIA may include an organic insulation material, such as polyimide.

The anode electrode ANO may be disposed on the via insulating layer VIA. The anode electrode may be electrically connected to the second capacitor electrode CPE2 through the anode contact hole ANH.

In some embodiments, the anode electrode ANO may have a stacked film structure in which a material layer having a high work function, such as indium tin oxide (ITO), indium zinc oxide (IZO), zinc oxide (ZnO), or indium oxide ($In_2O_3$) and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a mixture thereof are stacked, but is not limited thereto. In this case, the layer having the high work function may be disposed above the reflective material layer and disposed close to an emitting material layer EML to be described later. In some embodiments, the anode electrode ANO may have a multilayer structure of ITO/Mg, ITO/MgF, ITO/Ag, and ITO/Ag/ITO, but is not limited thereto.

The pixel defining film PDL may be disposed on the anode electrode ANO. The pixel defining film PDL may form an opening partially exposing the anode electrode ANO. In some embodiments, the pixel defining film PDL may include an organic insulation material, such as polyimide.

The emitting material layer EML may be disposed on a portion of the anode electrode ANO exposed by the pixel defining film PDL. The emitting material layer EML may include a hole injection/transport layer, an organic emitting material layer, and an electron injection/transport layer. A planar shape of the hole injection/transport layer and/or electron injection/transport layer may be the same as that of the organic emitting material layer, but is not limited thereto.

The cathode electrode CAT may be disposed on the emitting material layer EML and the pixel defining film PDL. The cathode electrode CAT may be electrically connected to the second voltage line VSL to apply the second power voltage to the emitting material layer EML.

In some embodiments, the cathode electrode CAT may include a material layer having a small work function, such as Li, Ca, LiF/Ca, LiF/Al, Al, Mg, Ag, Pt, Pd, Ni, Au, Nd, Ir, Cr, BaF, Ba, or a compound or mixture thereof (e.g., a mixture of Ag and Mg, etc.), but is not limited thereto. The cathode electrode CAT may further include a transparent metal oxide layer disposed on the material layer having the small work function.

Meanwhile, although it is described herein that the first capacitor electrode CPE1 as an example of the third conductive layer MTL3 protrudes based on the lower metal layer BML as an example of the first conductive layer MTL1, a position where the third conductive layer MTL3 protrudes from the first conductive layer MTL1 may vary according to the structure of the pixel PX. Hereinafter, a structure for preventing the protruding portion of the first capacitor electrode CPE1 from being disconnected by lowering the taper angle formed by the lower metal layer BML will be described.

Figure 6:
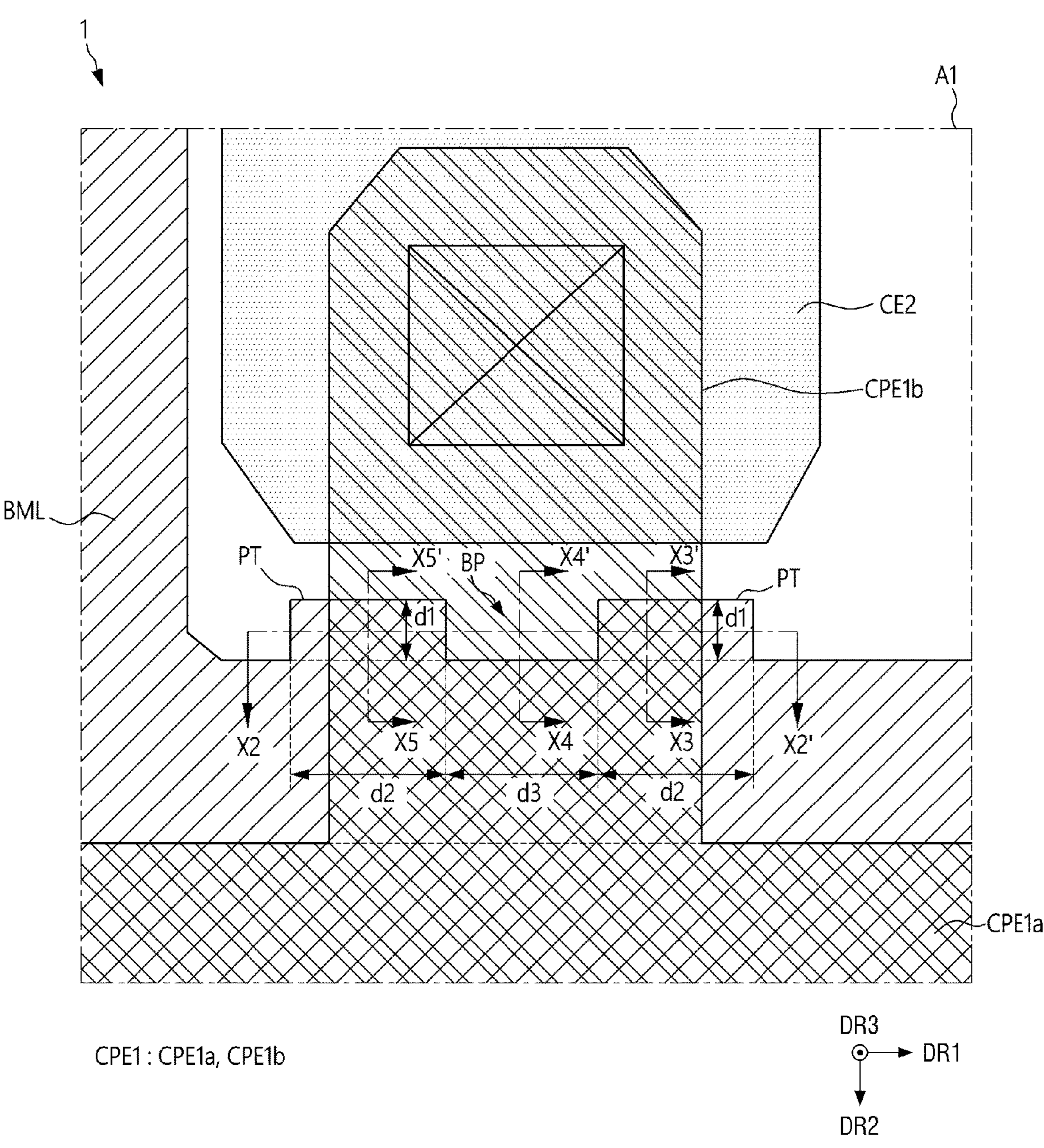
FIG. 6 is an enlarged view of area A1 of FIG. 4.
Figure 7:
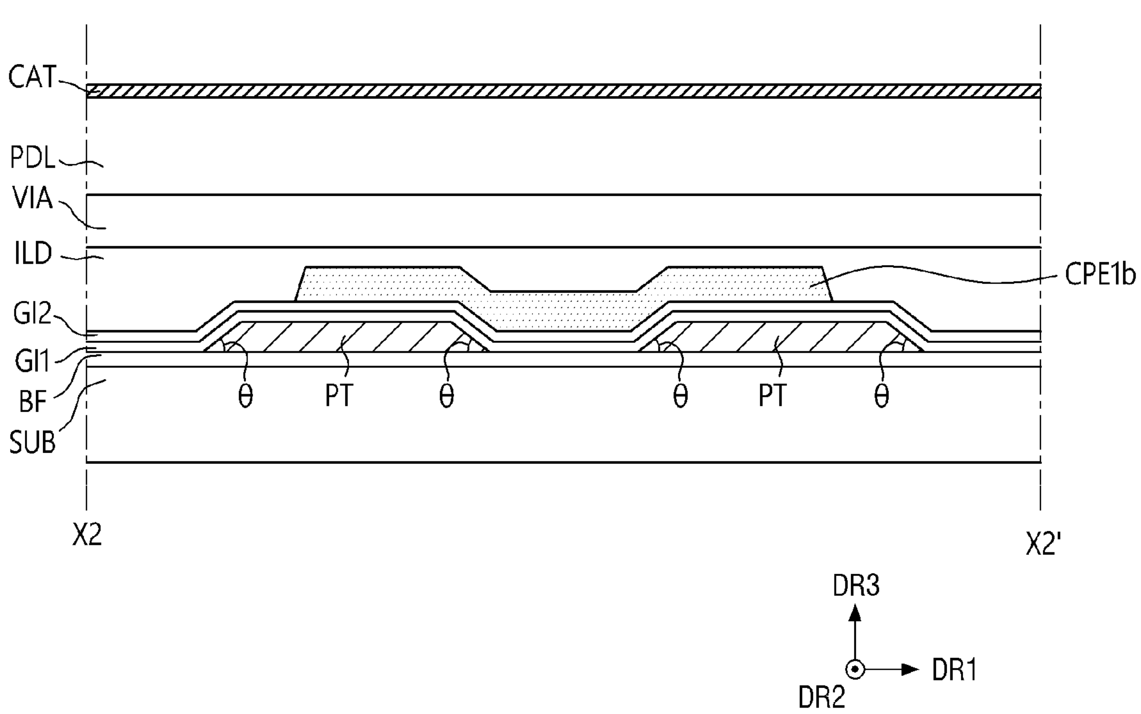
FIG. 7 is a cross-sectional view schematically illustrating a cross section taken along line X2-X2' of FIG. 6.
Figure 8:
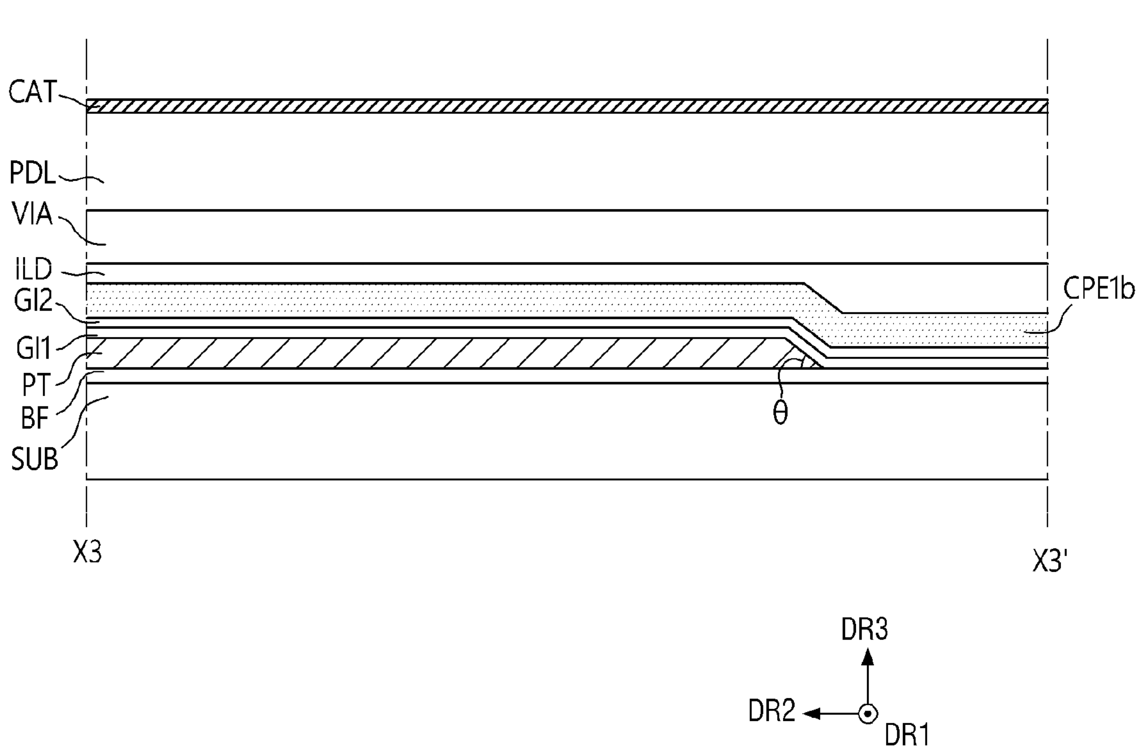
FIG. 8 is a cross-sectional view schematically illustrating a cross section taken along line X3-X3' of FIG. 6.

FIG. 6 is an enlarged view of area A1 of FIG. 4. FIG. 7 is a cross-sectional view schematically illustrating a cross section taken along line X2-X2' of FIG. 6. FIG. 8 is a cross-sectional view schematically illustrating a cross section taken along line X3-X3' of FIG. 6.

FIGS. 6 to 8 show an arrangement relationship between the first capacitor electrode CPE1 and the lower metal layer BML of the first sub-pixel SPX1. The arrangement relationship between the first capacitor electrode CPE1 and the lower metal layer BML of the first sub-pixel SPX1 is substantially the same as an arrangement relationship between the first capacitor electrode CPE1 and the lower metal layer BML of the second sub-pixel SPX2 and an arrangement relationship between the first capacitor electrode CPE1 and the lower metal layer BML of the third sub-pixel SPX3. Therefore, in the following, the arrangement relationship between the first capacitor electrode CPE1 and the lower metal layer BML of the first sub-pixel SPX1 will be mainly described, and a detailed description of the arrangement relationship between the first capacitor electrode CPE1 and the lower metal layer BML of the second sub-pixel SPX2 and the arrangement relationship between the first capacitor electrode CPE1 and the lower metal layer BML of the third sub-pixel SPX3 will be omitted.

Referring to FIGS. 6 to 8, the first capacitor electrode CPE1 of the display device 1 according to an embodiment may include a first portion CPE1*a* overlapping the lower metal layer BML and a second portion CPE1*b* protruding from the first portion CPE1*a* and extending to cross an edge of the lower metal layer BML. The second portion CPE1*b* may generally extend in the second direction DR2, but is not limited thereto. The second portion CPE1*b* may be electrically connected to the second connection electrode CE2 disposed thereon through a contact hole.

A concavo-convex pattern may be formed at an edge of the lower metal layer BML that overlaps the second portion CPE1*b*. The concavo-convex pattern may include a protruding portion PT protruding in the second direction DR2 and a recessed portion BP recessed from the protruding portion PT in the second direction DR2.

The protruding portions PT may be arranged in the first direction DR1. A separation space between the protruding portions PT may be defined as the recessed portion BP. FIG. 6 illustrates that the number of protruding portions PT is two and the number of recessed portions BP is one, but the number of protruding portions PT and recessed portions BP is not particularly limited.

An edge on one side of the second portion CPE1*b* in the first direction DR1 may be disposed on the protruding portion PT disposed on one side in the first direction DR1, and an edge on the other side of the second portion CPE1*b* in the first direction DR1 may be disposed on the protruding portion PT disposed on the other side in the first direction DR1.

At the edge of the lower metal layer BML overlapping the second portion CPE1*b*, the concavo-convex pattern may have a shape corresponding to a light blocking pattern formed on a mask MASK (see FIG. 13) for forming the lower metal layer BML. In other words, the protruding portion PT of the concave-convex pattern may have the same shape as the light blocking pattern of the mask MASK in a plan view, and the recessed portion BP may correspond to a gap between the light blocking patterns formed on the mask MASK.

A process of forming the lower metal layer BML is as follows. The lower metal layer BML is formed by entirely forming a material layer pBML (see FIG. 11) for a lower metal layer on the substrate SUB and then forming a photoresist PR (see FIG. 12) on the material layer pBML, exposing and developing the photoresist PR using a mask MASK to form a photoresist pattern PRa (see FIG. 14), and etching the material layer pBML for the lower metal layer on a lower side of the photoresist pattern PRa by using the photoresist pattern PRa as an etch mask.

In this case, an etching degree of the material layer pBML for the lower metal layer may increase in inverse proportion to a thickness of a cross-sectional profile of the photoresist pattern PRa disposed thereon. For example, an etching degree of the material layer pBML for the lower metal layer overlapping a portion having a thickness of a relatively low cross-sectional profile of the photoresist pattern PRa may be greater than an etching degree of the material layer pBML for the lower metal layer overlapping a portion having a thickness of a relatively high cross-sectional profile of the photoresist pattern PRa. In other words, a taper angle of the lower metal layer BML may be proportional to a taper angle of the photoresist pattern PRa disposed thereon.

The taper angle of the lower metal layer BML, in particular, the taper angle of an edge of the lower metal layer BML overlapping the second portion CPE1*b* may be gently adjusted by controlling the cross-sectional profile of the photoresist pattern PRa disposed thereon.

The concavo-convex pattern formed at the edge of the lower metal layer BML of the display device 1 according to an embodiment overlapping the second portion CPE1*b* may be formed by diffracting light incident on the photoresist PR at a portion overlapping the light blocking pattern of the mask MASK during the process of forming the lower metal layer BML, and the taper angle of the lower metal layer BML may be gently formed as the cross-sectional profile of the photoresist pattern PRa after developing is gently formed where the light incident on the photoresist PR is diffracted. This will be described in detail below.

Since the first gate insulating layer GI1, the second gate insulating layer GI2, and the third conductive layer MTL3 formed on the lower metal layer BML are formed along the profile of the lower metal layer BML, a cross-sectional profile of the protruding portion PT and a cross-sectional profile of the second portion CPE1*b* disposed thereon may be substantially the same. That is, a taper angle θ of the protruding portion PT, that is, an angle formed between a bottom surface of the protruding portion PT (i.e., one surface in contact with the buffer layer BF) and a side surface of the protruding portion PT (i.e., one surface in contact with the first gate insulating layer GI1) as illustrated in FIGS. 7 and 8 increases, the second portion CPE1*b* disposed thereon may be disconnected due to a crack formed in the second portion CPE1*b* disposed on the lower metal layer BML. Accordingly, it is necessary to lower the taper angle θ of the protruding portion PT.

Meanwhile, FIG. 8 illustrates a schematic cross-section of the protruding portion PT disposed on one side in the first direction DR1 along the line X3-X3', but such a schematic cross-section is substantially the same as the schematic cross-section of the recessed portion BP along the line X4-X4' and the schematic cross-section of the protruding portion PT disposed on the other side in the first direction DR1 along the line X5-X5'. Therefore, hereinafter, the schematic cross-sectional structure along the line X3-X3' will be mainly described, and a detailed description of the schematic cross-sectional structure along the line X4-X4' or the line X5-X5' will be omitted.

Figure 9:
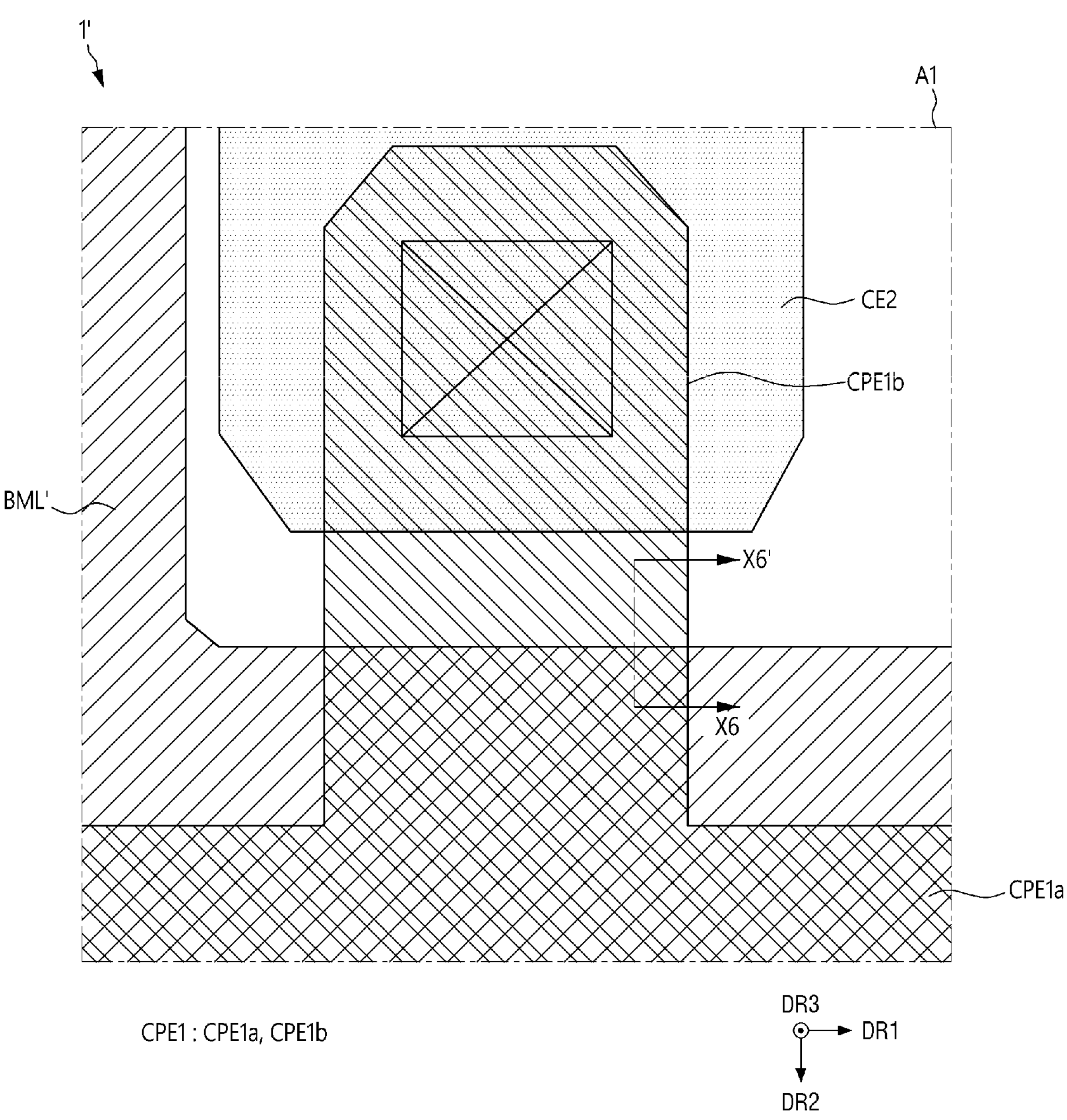
FIG. 9 is an enlarged view illustrating an overlapping relationship between a protruding portion of a first capacitor electrode and a lower metal layer of a display device according to a comparative example.
Figure 10:
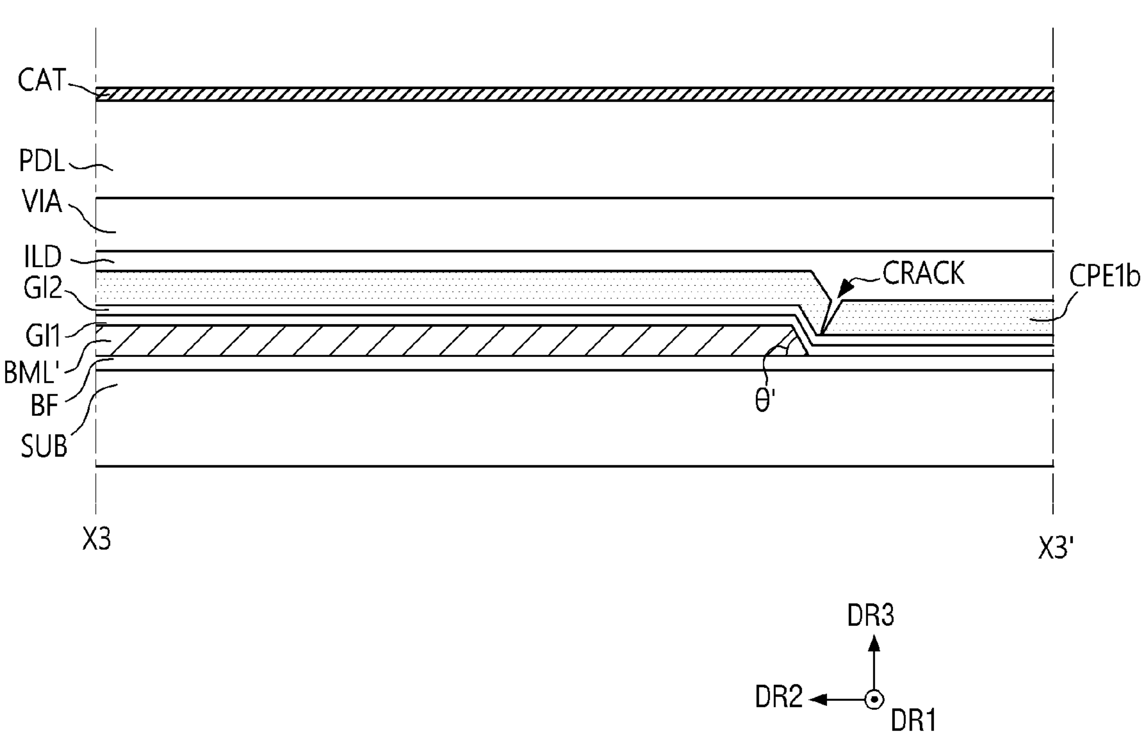
FIG. 10 is a cross-sectional view schematically illustrating a cross section taken along line X6-X6' of FIG. 9.

FIG. 9 is an enlarged view illustrating an overlapping relationship between a protruding portion of a first capacitor electrode and a lower metal layer of a display device according to a comparative example. FIG. 10 is a cross-sectional view schematically illustrating a cross section taken along line X6-X6' of FIG. 9.

Referring to FIGS. 9 and 10 together with FIGS. 6 to 8, a display device 1' according to a comparative example is different from the display device 1 according to the embodiment in that the concavo-convex pattern is not formed at a portion of a lower metal layer BML' overlapping the second portion CPE1*b*, and other configurations are substantially the same or similar.

In the display device 1' according to the comparative example, since light incident on the photoresist PR is not diffracted to the portion overlapping the light blocking pattern of the mask MASK during a process of forming a lower metal layer BML', a taper angle θ' of the protruding portion PT is formed to be about 800 or more, such that a step coverage of the second portion CPE1*b* disposed thereon may be worse than a step coverage of the second portion CPE1*b* disposed on the lower metal layer BML' having a better step coverage. Accordingly, a crack in which the second portion CPE1*b* is disconnected may be formed at a portion where the second portion CPE1*b* disposed on the lower metal layer BML' having a worse step coverage.

Referring back to FIGS. 6 to 8, the taper angle θ of the concave-convex pattern formed at the edge of the lower metal layer BML overlapping the second portion CPE1*b* by the manufacturing process of the display device described above may be 500 or less. When the taper angle θ of the protruding portion PT is 500 or more, the step coverage of the second portion CPE1*b* disposed on the lower metal layer BML' having a worse step coverage becomes worse, and thus a portion of the second portion CPE1*b* may be disconnected due to the crack as illustrated in FIG. 10.

The inventors of the present specification have confirmed that when at least one of a second width d2 of the protruding portion PT in the first direction DR1 and a separation distance between the protruding portions PT, that is, a third width d3 of the recessed portion BP in the first direction DR1 is 2 μm or less, the taper angle θ of the protruding portion PT is formed to be 500 or less through repeated experiments. In this case, the first width d1 of the protruding portion PT in the second direction DR2 is not particularly limited.

For example, when the light blocking pattern of the mask MASK is designed such that a length of the first width d1 is 3 μm, a length of the second width d2 is 2 μm, and a length of the third width d3 is 4 μm, a taper angle of the photoresist pattern PRa may be formed to be 45.2° and the taper angle θ of the protruding portion PT may be formed to be 500 or less, and when the light blocking pattern of the mask MASK is designed such that the length of the first width d1 is 3 μm, the length of the second width d2 is 6 μm, and the length of the third width d3 is 2 μm, the cross-sectional profile angle of the photoresist pattern PRa may be formed to be 42.28° and the taper angle θ of the protruding portion PT may be formed to be 500 or less.

With the configuration described above, it is possible to prevent or at least mitigate the disconnection of the protruding portion of the first capacitor electrode CPE1 by lowering the taper angle formed by the lower metal layer BML.

Hereinafter, a process of manufacturing the display device 1 according to an embodiment will be described.

FIGS. 11 to 16 are cross-sectional views for each process for describing a process of manufacturing a display device according to an embodiment. FIGS. 11 to 16 illustrate a cross-section corresponding to that of FIG. 7, that is, a structure corresponding to the schematic cross-sectional structure cut along the line X2-X2' for convenience of description.

Figure 11:
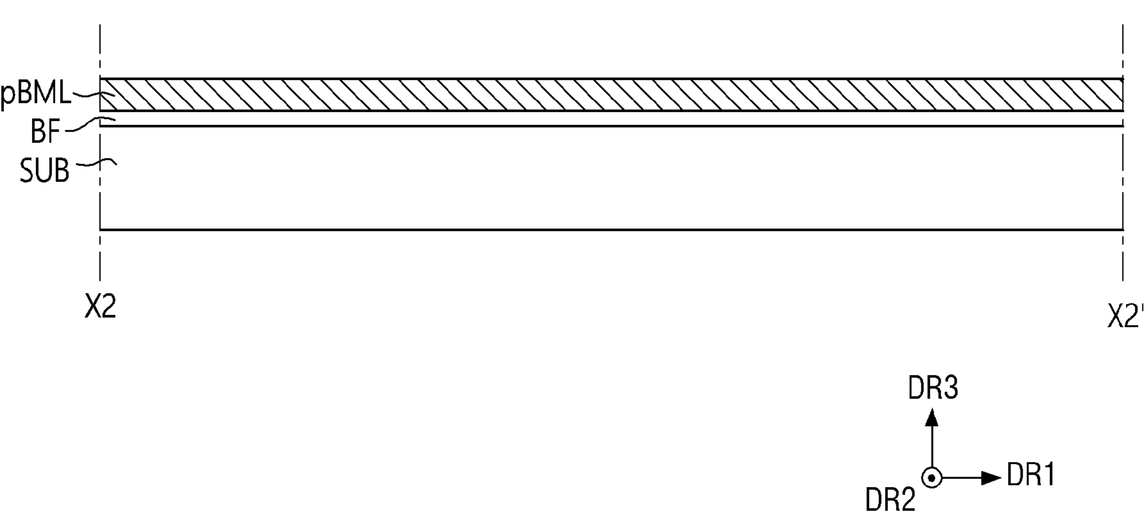
FIGS. 11, 12, 13, 14, 15 and 16 are cross-sectional views for each process for describing a process of manufacturing a display device according to an embodiment.

Referring to FIG. 11, a buffer layer BF and a material layer pBML for a lower metal layer are formed on a substrate SUB. The material layer pBML for the lower metal layer may be entirely formed on the buffer layer BF. The material layer pBML for the lower metal layer that is etched to become the lower metal layer BML may include substantially the same material as the lower metal layer BML.

Figure 12:
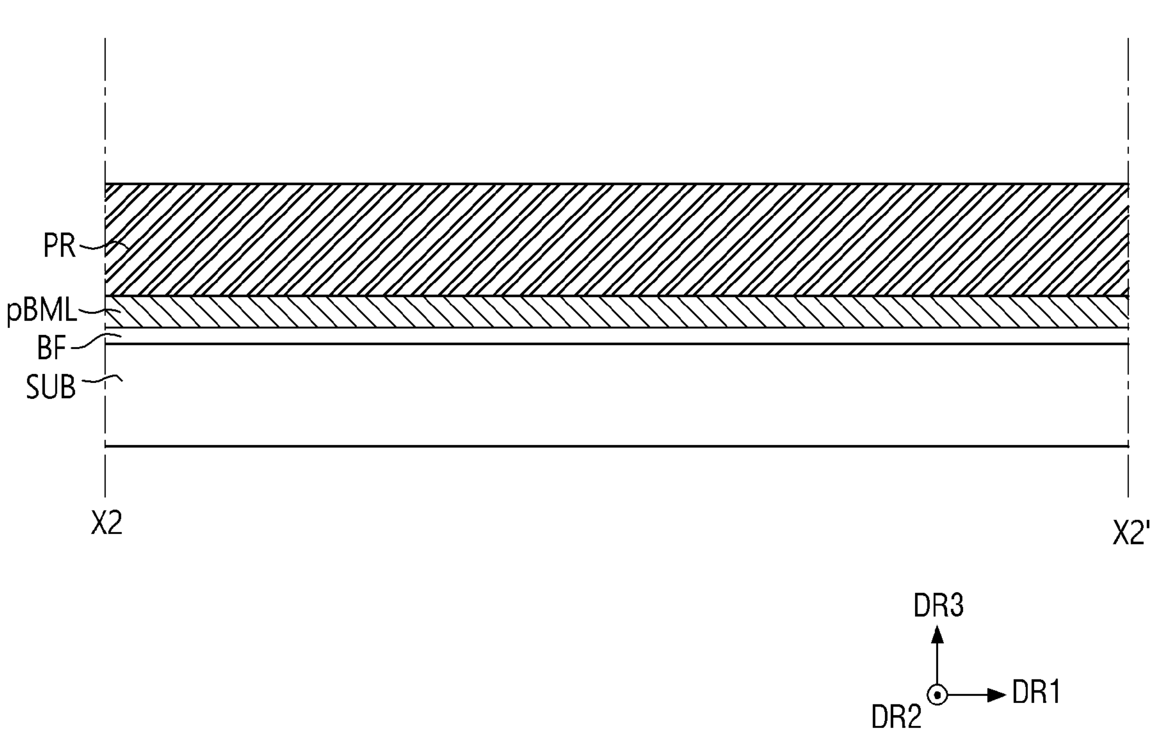

Next, referring to FIG. 12, a photoresist PR is formed on the material layer pBML for the lower metal layer. The photoresist PR may be entirely formed on the material layer pBML for the lower metal layer. The photoresist PR may include a photosensitive organic material.

Figure 13:
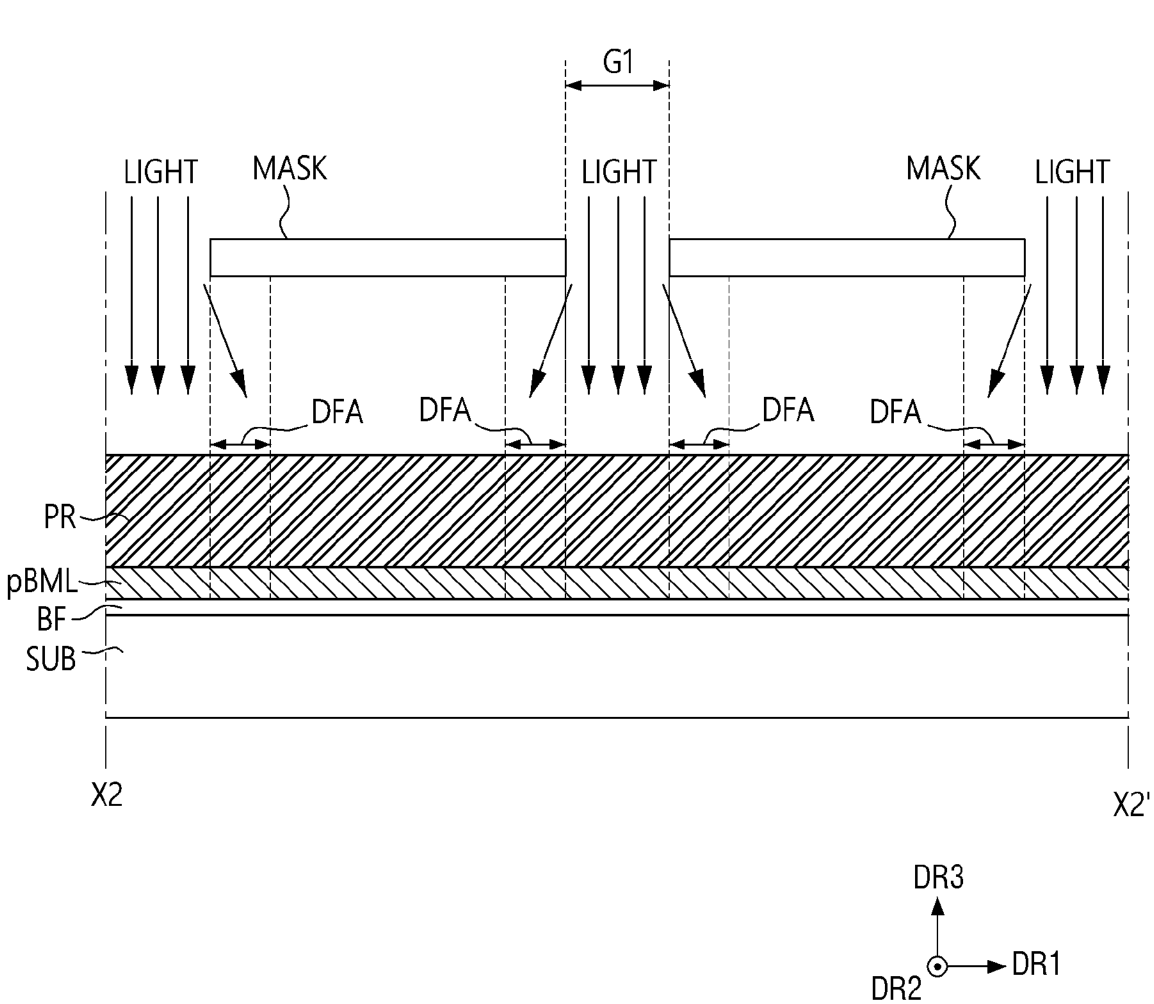
Figure 14:
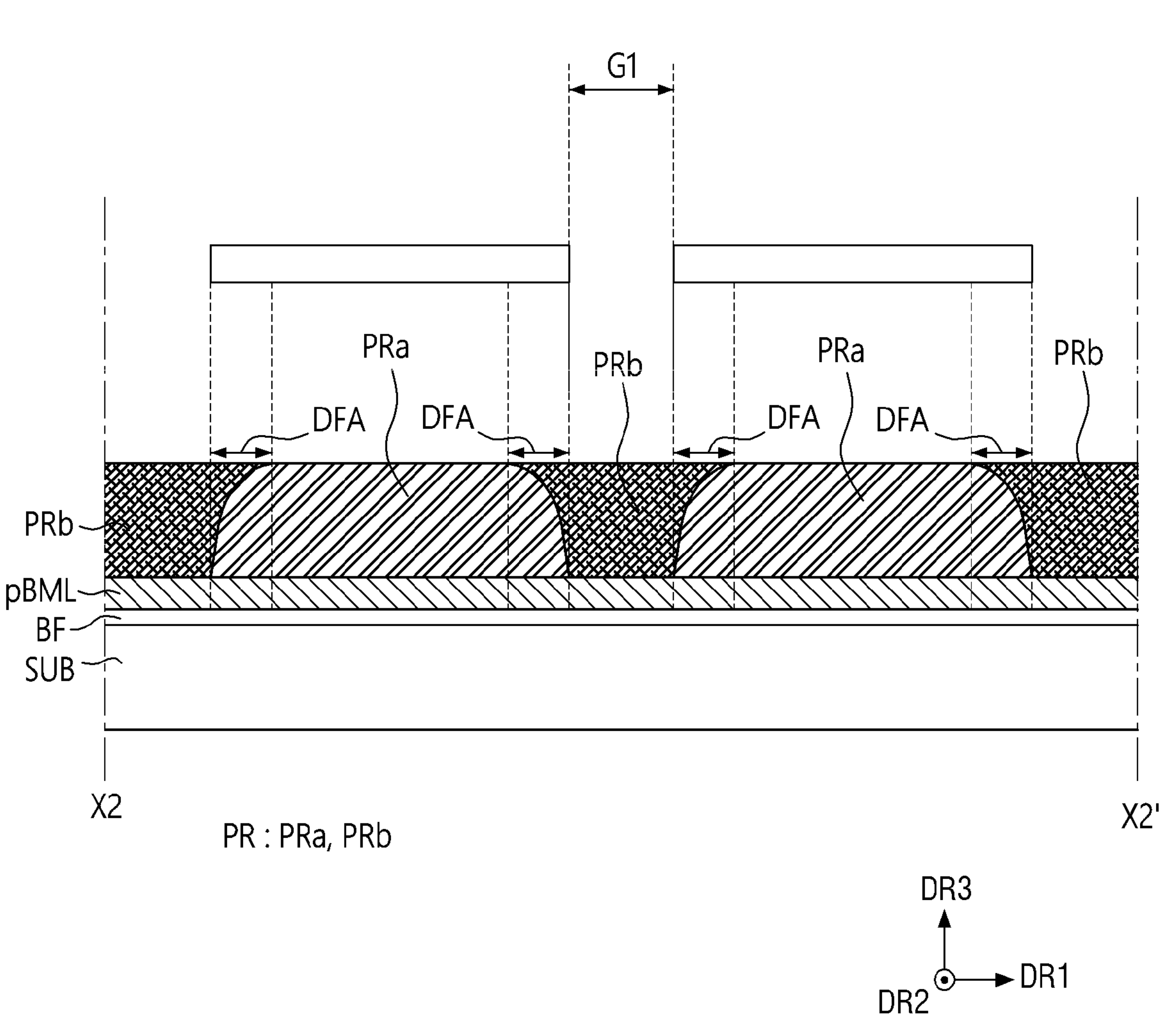

Next, referring to FIGS. 13 and 14, the photoresist PR is exposed using a mask MASK having a light blocking pattern formed therein. The photoresist PR may be exposed to form an exposed portion PRb and an unexposed portion PRa.

In this case, as light incident on the mask MASK is diffracted according to a gap G1 between the light blocking patterns in the mask MASK, the photoresist PR overlapping the light blocking pattern in the third direction DR3, that is, a diffractive area DFA, may be partially exposed.

In general, the diffraction of light incident on the mask MASK may occur better as the gap G1 between the light blocking patterns is smaller. For example, when the gap G1 between the light blocking patterns is 2 μm or less, the light incident on the mask MASK may be diffracted to expose the diffractive area DFA of the photoresist PR. When the gap G1 between the light blocking patterns exceeds 2 μm, the light exposed from the mask MASK may not be diffracted.

A degree of exposure of the diffractive area DFA of the photoresist PR may be smaller than a degree of exposure in a light transmitting pattern of the mask MASK, that is, a separation space between light blocking patterns. For example, a portion of the photoresist PR overlapping the light transmitting pattern of the mask MASK may be entirely exposed in the thickness direction, but the diffractive area DFA of the photoresist PR may not be entirely exposed in the thickness direction, but only a portion disposed on a surface of the photoresist PR may be exposed.

As a distance from the light transmitting pattern of the mask MASK decreases, an intensity of diffracted light decreases. Therefore, the degree of exposure of the diffractive area DFA of the photoresist PR may decrease in a direction away from the light transmitting pattern. Accordingly, a boundary between the exposed portion PRb and the unexposed portion PRa may have a gentle shape.

Meanwhile, the gap G1 between the light blocking patterns may be the same as the separation gap between the protruding portions PT illustrated in FIG. 6, that is, the third width d3. As described above, since the diffraction of exposed light occurs only when the gap G1 between the light blocking patterns is 2 μm or less, the third width d3 is formed to be 2 μm or less.

Figure 15:
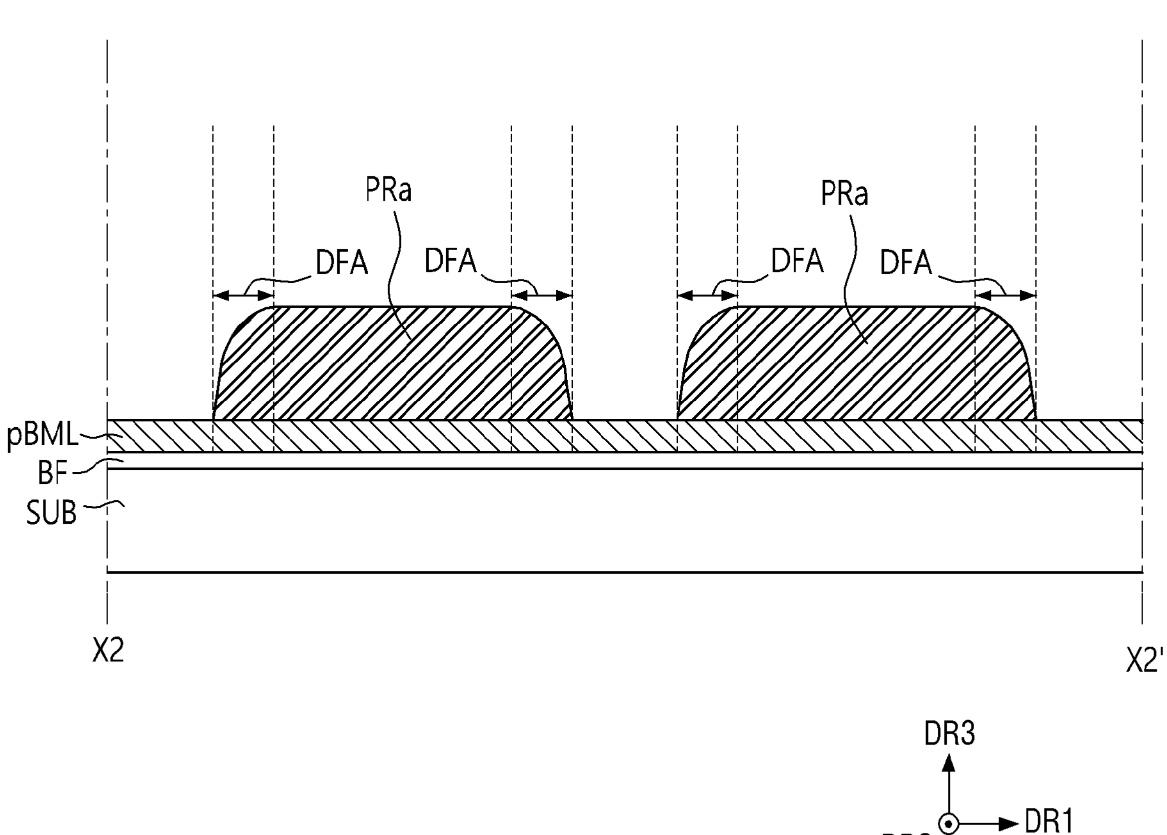
Figure 16:
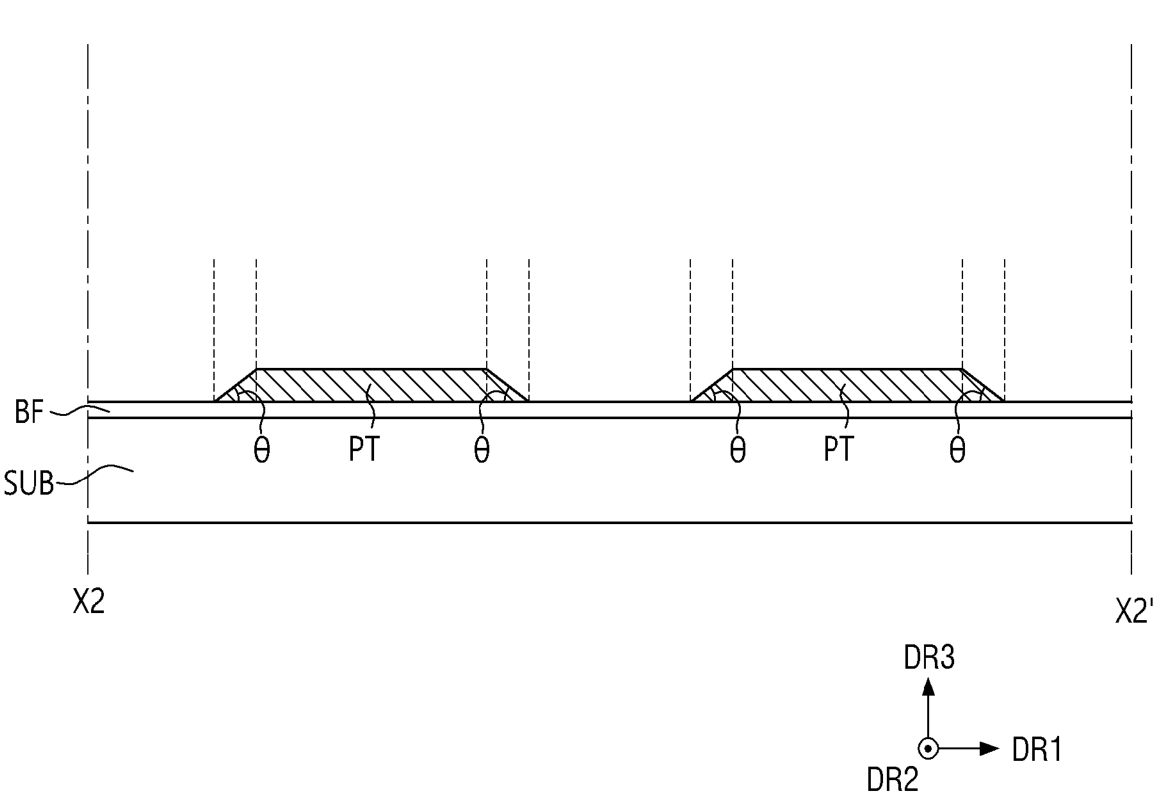

Next, referring to FIGS. 15 and 16, the photoresist PR is developed to leave only the photoresist pattern PRa which is unexposed, and the photoresist pattern PRa is used as an etch mask to etch the material layer pBML for the lower metal layer on a lower side thereof.

As described above, since the etching degree of the material layer pBML for the lower metal layer increases in inverse proportion to the thickness of the cross-sectional profile of the photoresist pattern PRa disposed thereon, the etching degree of the material layer pBML for the lower metal layer overlapping the portion having the thickness of the relatively low cross-sectional profile of the photoresist pattern PRa may be greater than the etching degree of the material layer pBML for the lower metal layer overlapping the portion having the thickness of the relatively high cross-sectional profile of the photoresist pattern PRa.

Accordingly, since the taper angle θ of the protruding portion PT of the lower metal layer BML is proportional to the taper angle of the photoresist pattern PRa disposed thereon, the taper angle θ of the protruding portion PT may be gently formed.

Next, the display device 1 according to an embodiment may be manufactured by sequentially forming a first gate insulating layer GI1, a second gate insulating layer GI2, and a third conductive layer MTL3 on the lower metal layer BML.

Hereinafter, another example of the display device 1 according to an embodiment will be described. In the following embodiments, the same components as those of the above-described embodiment will be denoted by the same reference numerals, and an overlapping description thereof will be omitted or simplified and differences will be mainly described.

Figure 17:
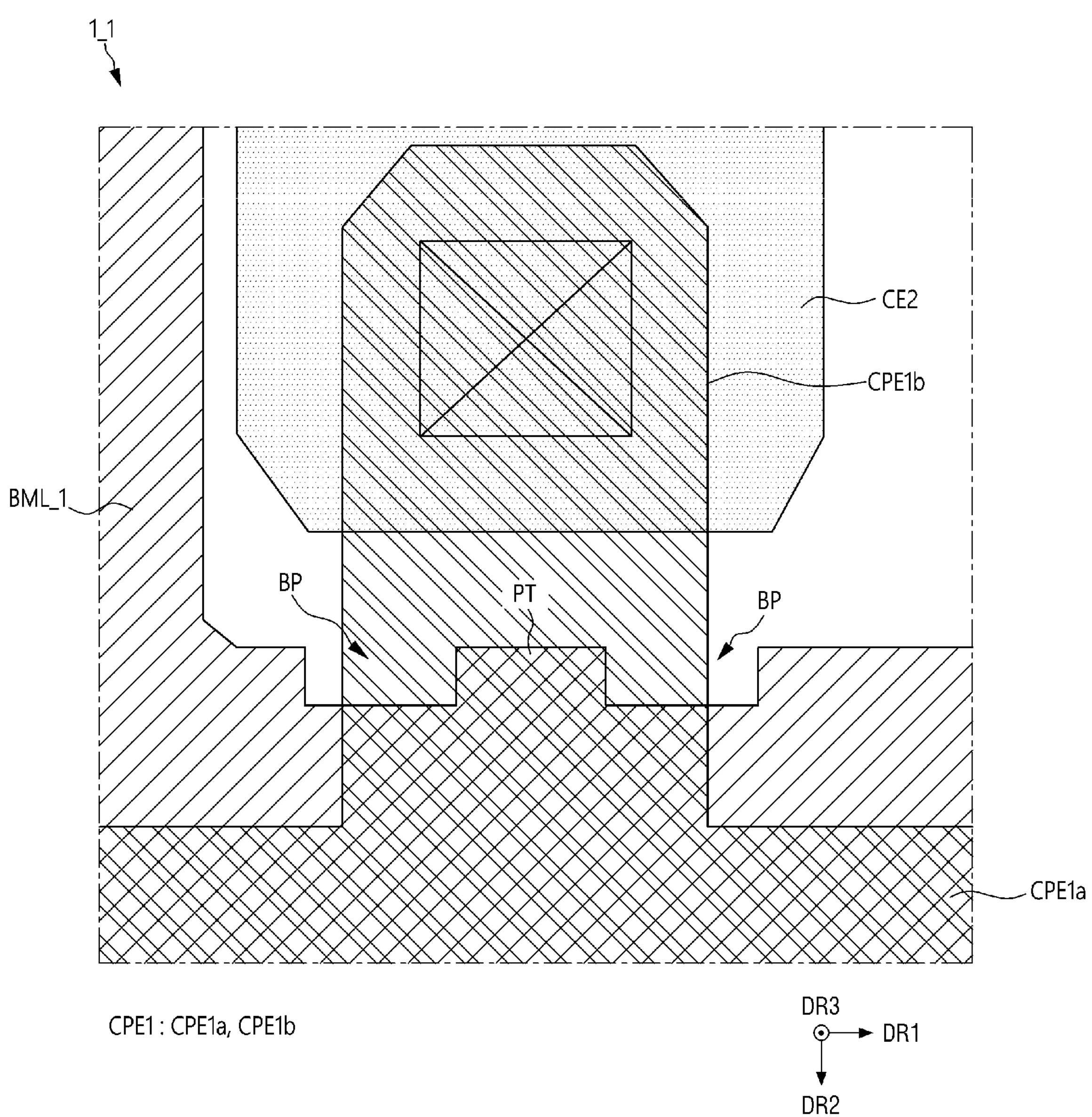
FIG. 17 is an enlarged view illustrating an overlapping relationship between a protruding portion of a first capacitor electrode and a lower metal layer of a display device according to another embodiment.

FIG. 17 is an enlarged view illustrating an overlapping relationship between a second portion of a first capacitor electrode and a lower metal layer of a display device according to another embodiment.

Referring to FIG. 17, it is illustrated that a concavo-convex pattern including two recessed portions BP and a protruding portion PT disposed therebetween in an area overlapping the second portion CPE1*b* of the first capacitor electrode CPE1 may be formed on a lower metal layer BML_1 of a display device 1_1 according to the present embodiment. The protruding portion PT may be defined as a separation space between recessed portions BP. A width of the recessed portion PT in the first direction DR1 and a separation distance between the recessed portions PT in the first direction DR1 is 2 μm or less, and a width of the protruding portion in the second direction is 2 μm or less.

For example, an edge on one side of the second portion CPE1*b* in the first direction DR1 may be disposed on the recessed portion BP disposed on the one side in the first direction DR1, and an edge on the other side of the second portion CPE1*b* in the first direction DR1 may be disposed on the recessed portion BP disposed on the other side in the first direction DR1.

Figure 18:
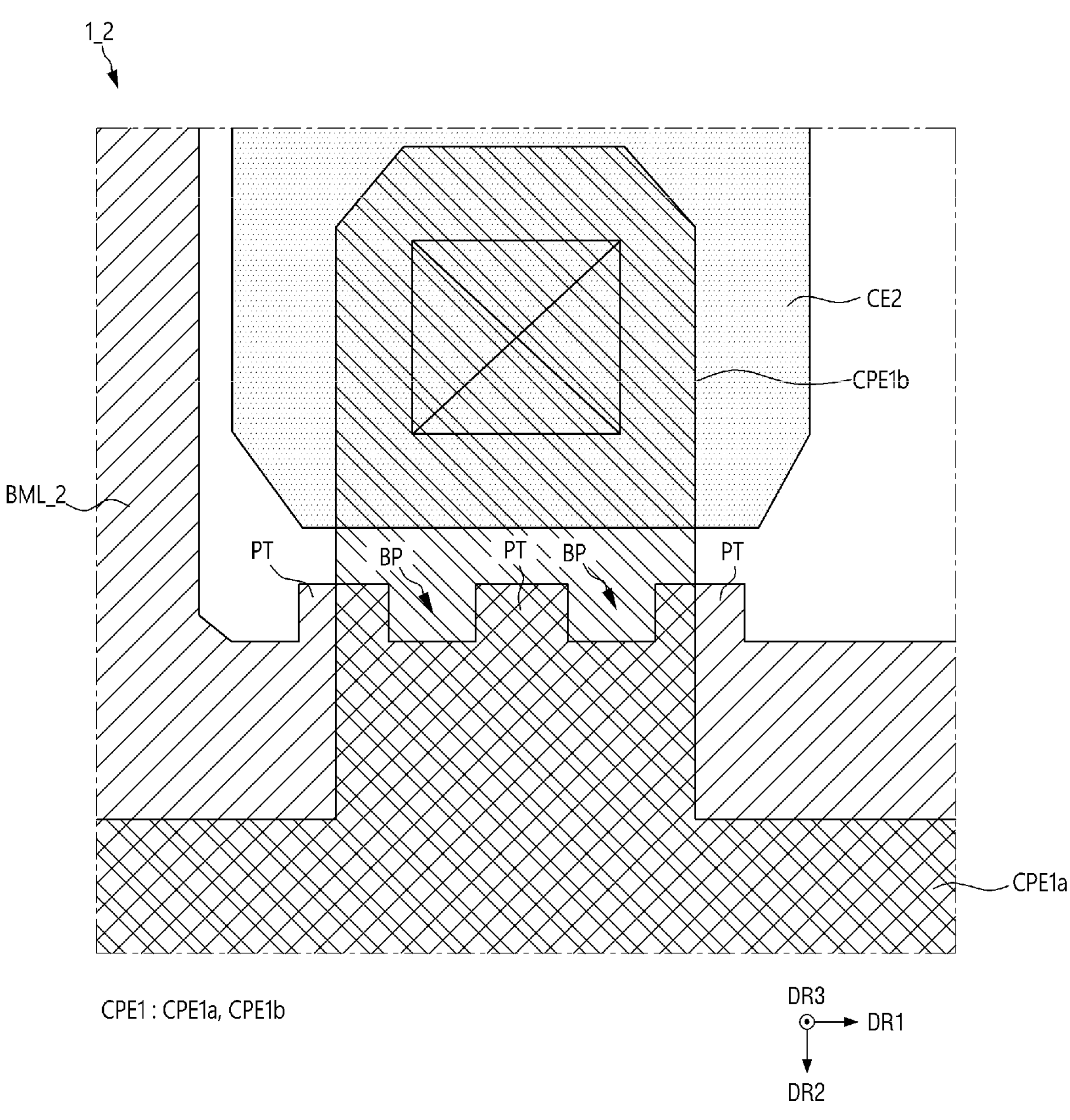
FIG. 18 is an enlarged view illustrating an overlapping relationship between a protruding portion of a first capacitor electrode and a lower metal layer of a display device according to still another embodiment.

FIG. 18 is an enlarged view illustrating an overlapping relationship between a second portion of a first capacitor electrode and a lower metal layer of a display device according to still another embodiment.

Referring to FIG. 18, it is illustrated that a concavo-convex pattern formed on a lower metal layer BML_2 of a display device 1_2 according to the present embodiment may include three or more protruding portions PT and two or more recessed portions BP. It is illustrated in FIG. 18 that three protruding portions PT are formed and two recessed portions BP are formed on the metal layer BML_2.

The number of protruding portions PT and the number of recessed portions BP of the concave-convex pattern formed on the lower metal layer BML_2 may vary according to a width of the second portion CPE1*b* of the first capacitor electrode CPE1 in the first direction DR1. For example, as the width of the second portion CPE1*b* of the first capacitor electrode CPE1 in the first direction DR1 increases, the number of protruding portions PT and the number of recessed portions BP of the concave-convex pattern formed on the lower metal layer BML_2 may increase.

In concluding the detailed description, those skilled in the art will appreciate that many variations and modifications can be made to the preferred embodiments without substantially departing from the principles of the present inventive concept. Therefore, the disclosed preferred embodiments of the inventive concept are used in a generic and descriptive sense only and not for purposes of limitation.

What is claimed is:

1. A display device comprising:

a substrate;

a lower metal layer disposed on the substrate;

a gate metal layer disposed on the lower metal layer, a buffer layer disposed between the substrate and the lower metal layer; and a first gate insulating layer disposed between the lower metal layer and the gate metal layer, wherein the gate metal layer includes:

a first portion covering the lower metal layer in a plan view; and a second portion protruding in a first direction from the lower metal layer in a plan view, and wherein the lower metal layer includes a concavo-convex pattern disposed at a portion overlapping the second portion of the gate metal layer, a bottom surface of the concavo-convex pattern in contact with the buffer layer, a side surface of the concavo-convex pattern is in contact with the first gate insulating layer, and an angle formed by the bottom surface and the side surface of the concavo-convex pattern is 50° or less.

2. The display device of claim 1, wherein the concavo-convex pattern includes:

a protruding portion protruding away from the first portion in the first direction; and a recessed portion recessed toward the first portion in the first direction, and wherein an edge of the second portion of the gate metal layer extending in the first direction overlaps the protruding portion.

3. The display device of claim 2, wherein the protruding portion includes a first protruding portion and a second protruding portion spaced apart from each other in a second direction intersecting the first direction, and wherein the recessed portion is a portion disposed between the first protruding portion and the second protruding portion.

4. The display device of claim 3, wherein the edge includes a first edge and a second edge opposing the first edge, and wherein the first edge overlaps the first protruding portion and the second edge overlaps the second protruding portion.

5. The display device of claim 4, wherein at least a portion of the first protruding portion protrudes in the second direction from the first edge, and wherein at least a portion of the second protruding portion protrudes in the second direction from the second edge.

6. The display device of claim 5, wherein the recessed portion is completely covered by the second portion of the gate metal layer.

7. The display device of claim 3, wherein a width of the protruding portion in the first direction is 2 μm or less and a width of the protruding portion in the second direction is 2 μm or less.

8. The display device of claim 7, wherein a width of the recessed portion in the second direction is 2 μm or less.

9. The display device of claim 1, wherein the concavo-convex pattern includes:

a protruding portion protruding away from the first portion in the first direction; and a recessed portion recessed toward the first portion in the first direction, and wherein an edge of the second portion of the gate metal layer overlaps the recessed portion.

10. The display device of claim 9 wherein the recessed portion includes a first recessed portion and a second recessed portion spaced apart from each other in a second direction intersecting the first direction, and wherein the protruding portion is a portion disposed between the first recessed portion and the second recessed portion.

11. The display device of claim 10, wherein the first edge overlaps the first recessed portion, and wherein the second edge overlaps the second recessed portion.

12. The display device of claim 11, wherein at least a portion of the first recessed portion protrudes in the second direction from the first edge, and at least a portion of the second recessed portion protrudes in the second direction from the second edge.

13. The display device of claim 12, wherein the protruding portion is completely covered by the second portion of the gate metal layer.

14. The display device of claim 10, wherein a width of the recessed portion in the second direction is 2 μm or less.

15. The display device of claim 14, wherein a width of the protruding portion in the second direction is 2 μm or less.

* * * * *